(12) United States Patent
Takanami et al.

(10) Patent No.: US 8,532,359 B2
(45) Date of Patent: Sep. 10, 2013

(54) BIODATA MODEL PREPARATION METHOD AND APPARATUS, DATA STRUCTURE OF BIODATA MODEL AND DATA STORAGE DEVICE OF BIODATA MODEL, AND LOAD DISPERSION METHOD AND APPARATUS OF 3D DATA MODEL

(75) Inventors: Kentaro Takanami, Kamakura (JP); Manabu Nagasaka, Kamakura (JP); Hideo Sakamoto, Kamakura (JP); Masato Ogata, Kamakura (JP); Hideo Yokota, Wako (JP); Hiroyuki Shimai, Wako (JP)

(73) Assignees: Mitsubishi Precision Co., Ltd., Tokyo (JP); Riken, Saitama (JP)

( * ) Notice: Subject to any disclaimer, the term of this patent is extended or adjusted under 35 U.S.C. 154(b) by 255 days.

(21) Appl. No.: 13/003,607

(22) PCT Filed: Jul. 10, 2009

(86) PCT No.: PCT/JP2009/062933
§ 371 (c)(1),
(2), (4) Date: Mar. 7, 2011

(87) PCT Pub. No.: WO2010/005119
PCT Pub. Date: Jan. 14, 2010

(65) Prior Publication Data
US 2011/0150312 A1    Jun. 23, 2011

(30) Foreign Application Priority Data

Jul. 11, 2008   (JP) .................................. 2008-181991

(51) Int. Cl.
*G06K 9/00*     (2006.01)
*A61B 6/00*     (2006.01)

(52) U.S. Cl.
USPC .............................. 382/131; 382/154; 378/21

(58) Field of Classification Search
USPC ................. 382/100, 103, 106–107, 128, 129, 382/130, 131, 132, 133, 134, 154, 162, 168, 382/173, 181, 199, 232, 254, 274, 276, 285–295, 382/305, 312, 159; 345/424; 600/1, 463; 703/11; 378/4, 21
See application file for complete search history.

(56) References Cited

U.S. PATENT DOCUMENTS 7,604,601 B2 * 10/2009 Altmann et al. .............. 600/463
7,611,452 B2 * 11/2009 Allison et al. .................... 600/1
(Continued)

FOREIGN PATENT DOCUMENTS

| JP | 1-95375 | 4/1989 |
| JP | 4-183446 | 6/1992 |

(Continued)

*Primary Examiner* — Seyed Azarian
(74) *Attorney, Agent, or Firm* — Brundidge & Stanger, P.C.

(57) ABSTRACT

Medical image data is utilized, physical values are assigned to body parts based on image information, and the target organs are separated from the image data to prepare a 3D biodata model to thereby realize a data model unique to a patient, having an internal structure, and enabling dynamic simulation of a live body. The same target part of a body is captured by CT and MRI to obtain medical images. Sets of pairs of CT images and MRI images are set, a plurality of features showing the same locations are selected and set from the sets of CT images and MRI images, a conversion coefficient between the CT images and MRI images is obtained, and this conversion coefficient is used to rearrange the MRI images by projection transforms and linear interpolation, combine them with the contours of the CT images, and correct their positions in the contours. Further, the images are used to prepare a 3D data model.

19 Claims, 27 Drawing Sheets

(56) References Cited

U.S. PATENT DOCUMENTS

| | | | |
|---|---|---|---|
| 8,149,237 B2 * | 4/2012 | Nakao et al. | 345/424 |
| 8,311,791 B1 * | 11/2012 | Avisar | 703/11 |
| 2011/0044534 A1 * | 2/2011 | Dewan et al. | 382/159 |

FOREIGN PATENT DOCUMENTS

| | | |
|---|---|---|
| JP | 10-11593 | 1/1998 |
| WO | 2005/111944 | 11/2005 |
| WO | 2007/015365 | 2/2007 |

* cited by examiner

Fig. 21
(a)
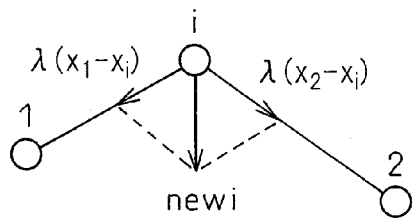
POINTS WITH LARGE CHANGE FROM SURROUNDINGS MADE TO MOVE BY LARGE AMOUNT
(b)
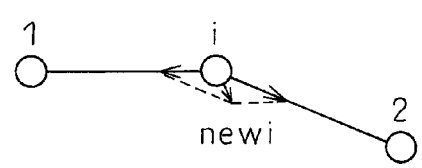
POINTS WITH SMALL CHANGE NOT MADE TO MOVE MUCH
Fig. 22
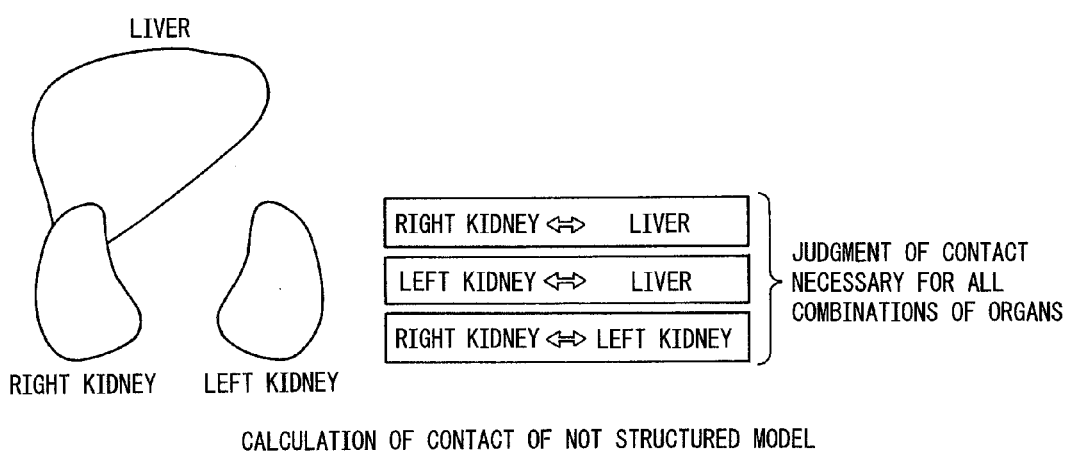
CALCULATION OF CONTACT OF NOT STRUCTURED MODEL

METHOD OF PARTITION OF MODEL(1)

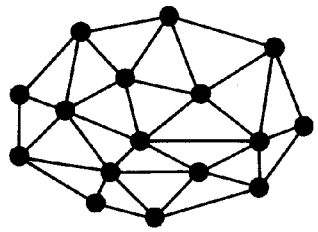

NUMBER OF NODES=16. IF PARTITIONING INTO 3, NUMBERS OF NODES OF INDIVIDUAL PARTITIONED MODEL SECTIONS WOULD BECOME 5.3, SO PARTITIONED MODEL SECTIONS ARE CONSTRUCTED SO AS TO HAVE ABOUT 5 NODES.
PARTITIONED MODEL SECTIONS ARE DETERMINED FROM END. COUNT NUMBER OF NODES IN BOUNDARY (2).
MOVE BOUNDARY LITTLE BY LITTLE OR COUNT NUMBER OF NODES. REPEAT UNTIL BECOMING ABOUT 5.
WHEN CONDITIONS ARE SATISFIED, GIVE NEXT BOUNDARY.

(b)

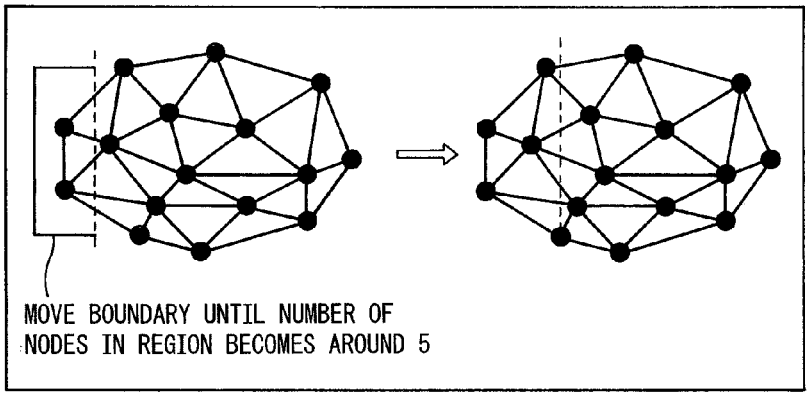

MOVE BOUNDARY UNTIL NUMBER OF NODES IN REGION BECOMES AROUND 5

 NEXT BOUNDARY (c)

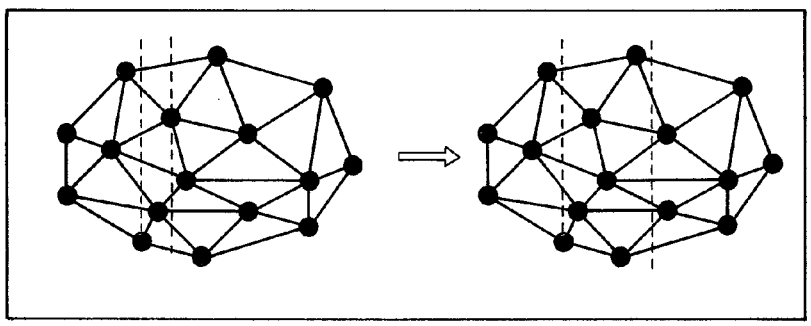

TECHNIQUE FOR REALIZATION 2

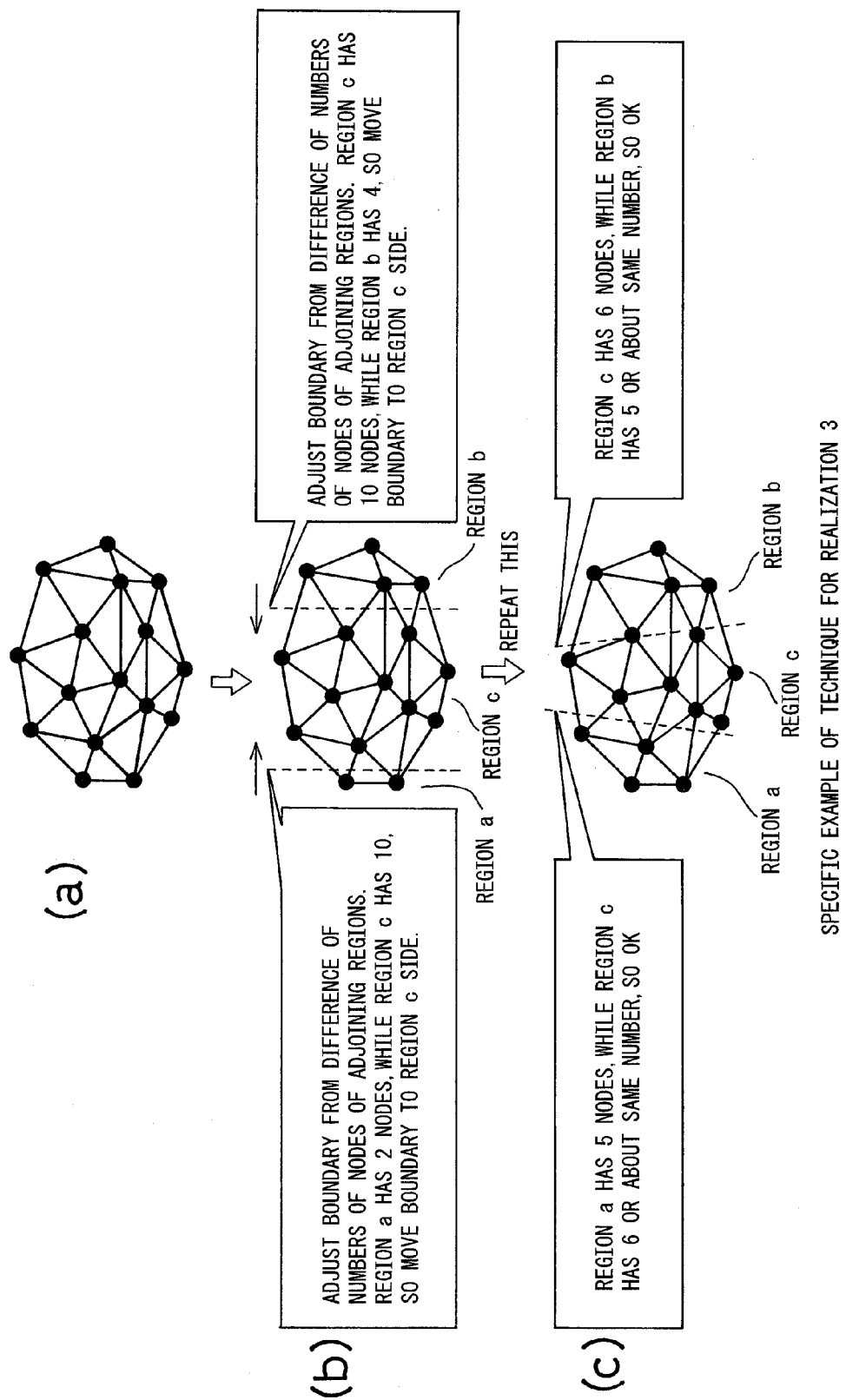

BIODATA MODEL PREPARATION METHOD AND APPARATUS, DATA STRUCTURE OF BIODATA MODEL AND DATA STORAGE DEVICE OF BIODATA MODEL, AND LOAD DISPERSION METHOD AND APPARATUS OF 3D DATA MODEL

TECHNICAL FIELD

The present invention relates to a method and apparatus for preparation of biodata used for a surgical simulation, a data structure of that biodata and a data storage device of the same, and a load dispersion method and apparatus of a 3D data model for processing a biodata model.

BACKGROUND ART

In recent years, medicine and engineering have been rapidly merging. Surgical simulators which utilize cutting edge processing techniques have been proposed. These express a live body targeted for surgery by polygons and basically simulate only the surfaces of organs. For this reason, accurate dynamic simulation of complicated organs having internal structures has not been possible. Preparation of models by 3D volume data has therefore become an urgent task.

SUMMARY OF INVENTION

Technical Problem

The problem to be solved is the preparation, along with the development of surgical simulators, of a data model which is unique to the patient, has an internal structure, and enables dynamic simulation of a live body. The components for realization of this are as follows:
  Increased utilization of medical image data
  Assignment of physical values to body parts of image information
  Separation of targeted organs from image data
  Preparation of 3D biodata model

Solution to Problem

The above-mentioned problem is solved by a biodata model preparation method which prepares a dynamic 3D data model of a live body from CT (computed tomography) images of that live body and MRI (magnetic resonance imaging) images of that live body and which is realized by a computer, the biodata model preparation method comprising correcting distortion of the MRI images from the CT images and laying them over the CT images to thereby generate CT/MRI images of the live body with pixels having CT values and MRI values, determining 3D regions corresponding to organs targeted for modeling in the CT/MRI images to thereby generate 3D data where 3D regions of organs targeted for modeling are identified, converting CT values and/or MRI values of pixels in the 3D regions in the 3D data to physical values, and using 3D data having the physical values to generate a dynamic 3D data model of the live body expressed by a set of tetrahedron elements.

The above-mentioned problem is solved by a biodata model preparation apparatus which prepares a dynamic 3D data model of a live body from CT (computed tomography) images of that live body and MRI (magnetic resonance imaging) images of that live body, the biodata model preparation apparatus comprising a means for correcting distortion of the MRI images from the CT images and laying them over the CT images to thereby generate CT/MRI images of the live body with pixels having CT values and MRI values, a means for determining 3D regions corresponding to organs targeted for modeling in the CT/MRI images to thereby generate 3D data where 3D regions of organs targeted for modeling are identified, a means for converting CT values and/or MRI values of pixels in the 3D regions in the 3D data to physical values, and a means for using 3D data having the physical values to generate a dynamic 3D data model of the live body expressed by a set of tetrahedron elements.

Further, the data structure of a biodata model in the present invention is a data structure which uses medical image data to construct a 3D data model, which structure provides organs as parts forming a predetermined range of a live body and simple geometric shapes surrounding the organs and uses nodes defining positional relationships of the organs to construct a tree shape.

The data storage device of a biodata model in the present invention is a device which stores data of a biodata model which uses medical image data to construct a 3D data model, which device stores data in a manner providing organs as parts forming a predetermined range of the body and simple geometric shapes surrounding the organs and using nodes defining positional relationships of the organs to construct a tree shape.

The load dispersion method in the present invention partitions, into a number P, a load among a P number of processing devices which perform simulation processing in parallel, when simulating motion for a 3D data model prepared from medical image data, so that the numbers of vertices of finite elements of the 3D data model become substantially uniform and so that the partition planes do not intersect in the 3D data model.

The load dispersion system in the present invention comprises a P number of processing devices which perform simulation processing in parallel when simulating motion for a 3D data model prepared from medical image data and partition the load into the number P so that the numbers of vertices of finite elements of the 3D data model become substantially uniform and so that the partition planes do not intersect in the 3D data model and communication lines which connect adjoining processing devices among the plurality of processing devices.

BRIEF DESCRIPTION OF THE DRAWINGS

FIG. 21 is a view for explaining an example of smoothing;

FIG. 22 is a view for explaining an example of contact calculation of a non-structured model;

FIG. 32 is a view for explaining an example of the partition processing;

FIG. 34 is a view for explaining an example of the partition processing.

EMBODIMENTS OF INVENTION

Figure 1:
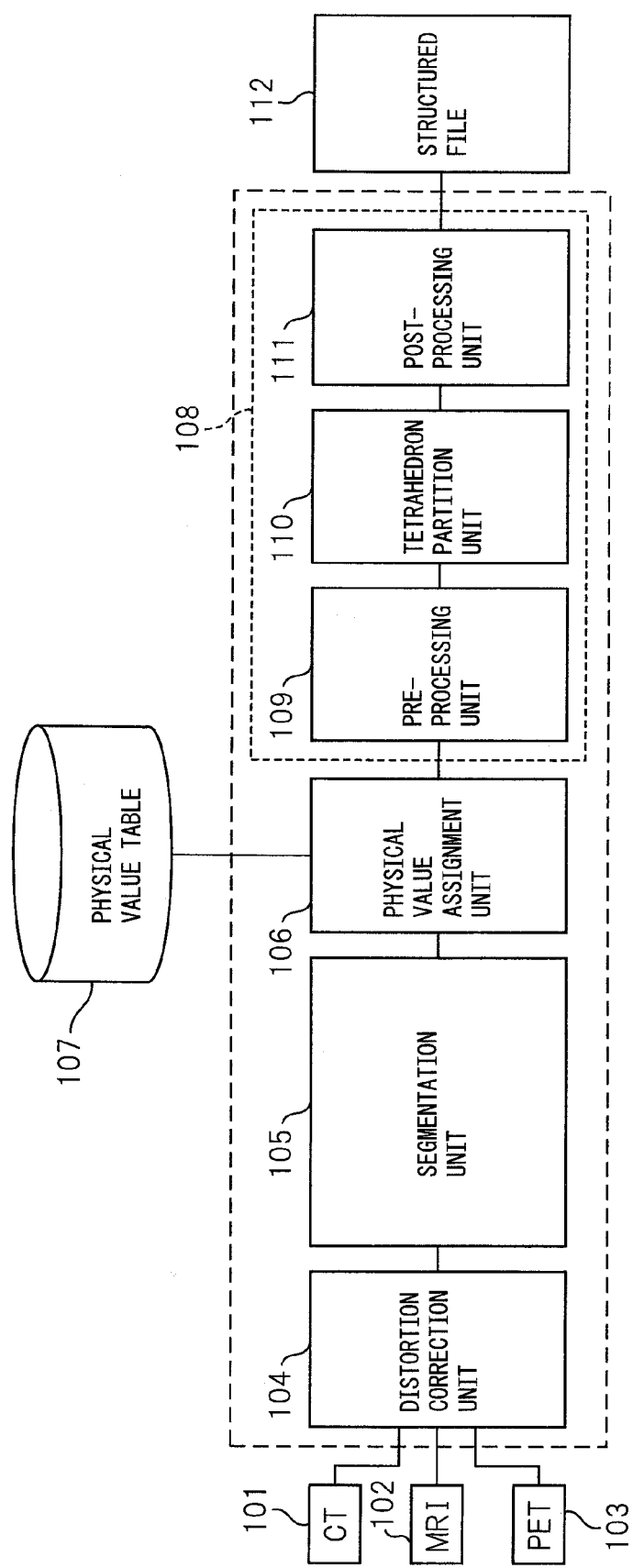
FIG. 1 is a functional block diagram for explaining an example of a biodata model preparation system.

FIG. 1 is a functional block diagram for explaining an example of a biodata model preparation apparatus. In FIG. 1, 101 indicates a CT (computed tomography) image data file, 102 indicates an MRI (magnetic resonance imaging) image data file, 103 indicates a PET (positron emission tomography) image data file, 104 indicates a distortion correction unit, 105 indicates a segmentation unit, 106 indicates a physical value assignment unit, 107 indicates a physical value table, 108 indicates a finite element partition unit, 109 indicates a pre-processing unit, 110 indicates a tetrahedron partition unit, 111 indicates a post-processing unit, and 112 indicates a structured file. The distortion correction unit 104 to the post-processing unit 111 as a whole are comprised by a computer which realizes functions of the individual blocks. Further, the CT image data file 101, MRI image data file 102, and PET image data file 103 are medical image data and store a plurality of images which successively capture cross-sections of the live body for a predetermined range in the height direction of the backbone, that is, slice images. The CT, MRI, and PET respectively form image sensors. These images give sensor images. The sensor images have sensor values called CT values, MRI values, or PET values. The intrinsic values for the material characteristics of the tissues are displayed as densities of color.

Figure 2:
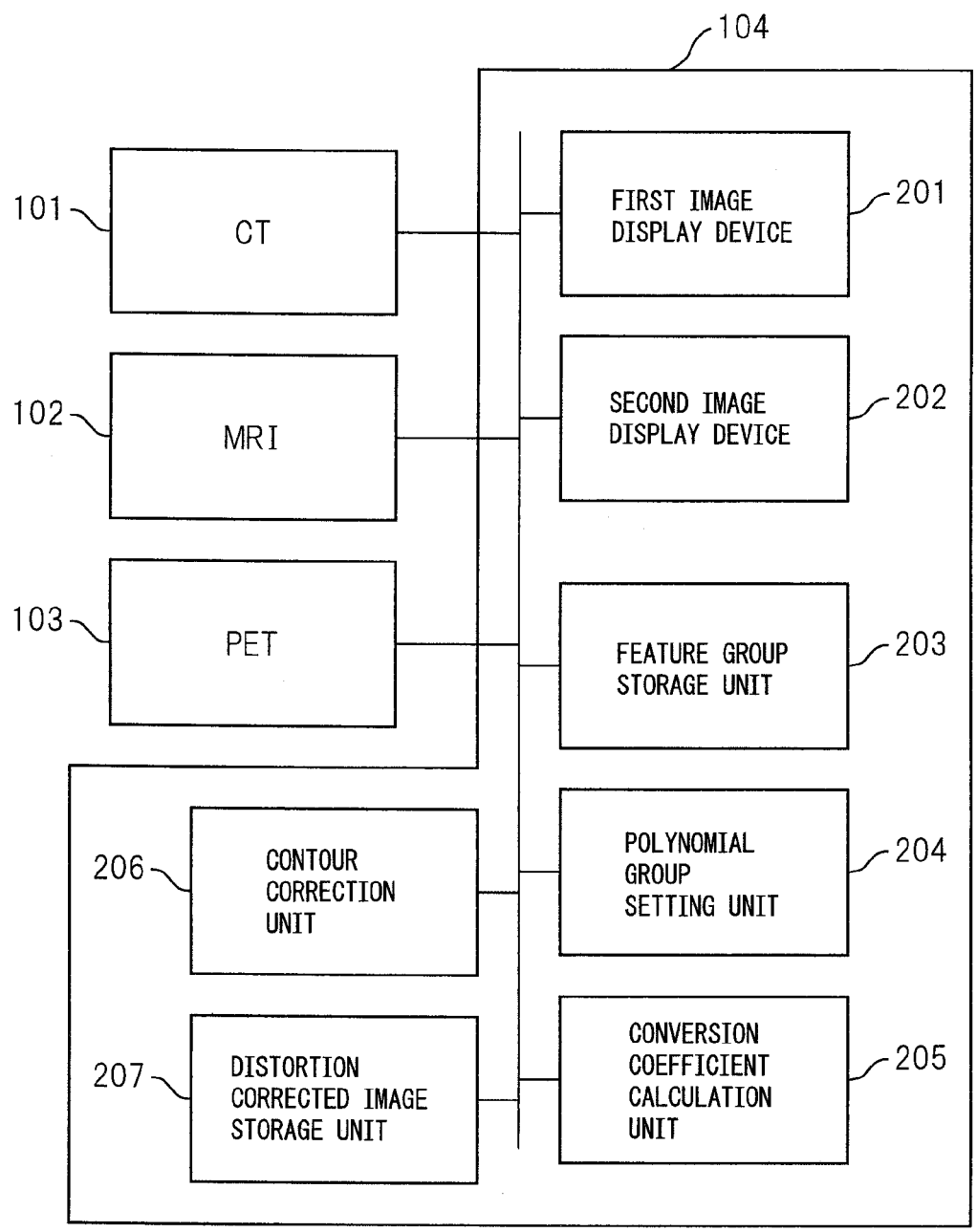
FIG. 2 is a functional block diagram of an example of a distortion correction unit.
Figure 3:
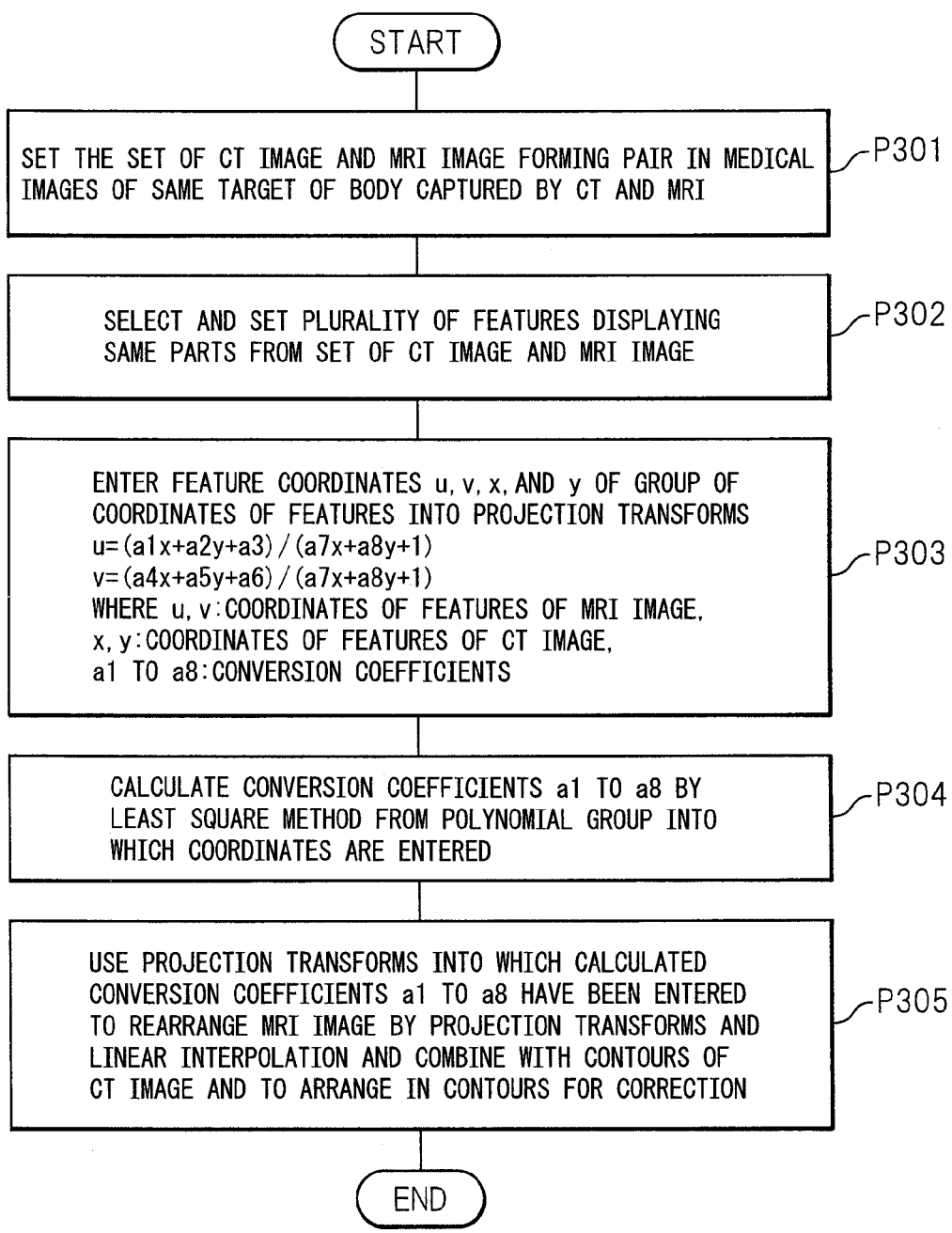
FIG. 3 is a flowchart for explaining an example of the technique for obtaining a cross-sectional image of a living body.

FIG. 2 and FIG. 3 are a block diagram and flowchart for explaining an example of the technique for obtaining more preferable cross-sectional images of a living body based on cross-sectional images of the living body from two different types of image sensor data. FIG. 2 includes the distortion correction unit 104 in FIG. 1.

An operator, for example, selects from the CT image data file 101, MRI image data file 102, or PET image data file 103 of the surgical patient the pair of, for example, the CT image data file 101 and MRI image data file 102 (FIG. 3, process P301) and displays a CT image on the screen of the first image display device 201 and an MRI image on the screen of the second image display device 202 as a set. At this time, the images which are displayed are for the same cross-section of the body of the same person. It is possible to successively switch cross-sectional locations for display. A CT image has the features of a higher spatial resolution than an MRI image. Even at the time of capture, no distortion occurs, so it is possible to more accurately capture the shape of the tissue. An MRI image has a higher resolution of soft tissue, so has a greater amount of information than a CT image. Therefore, it enables a greater amount of physical values of tissue to be obtained compared with a CT image, but depending on the imaging device, distortion is sometimes caused at the time of capture. The shape is sometimes not accurately reflected. Each image differs in features. To make use of the respective advantages, the tissue images obtained by an MRI image are rearranged on the shapes of contours etc. of a CT image. Note that, PET is one type of computed tomography and is used for cancer diagnosis etc. It becomes possible to generate a model of a cancerous organ using both an CT image and an MRI image.

In the examples, a CT image and an MRI image are selected and tissue images obtained by the MRI image are rearranged on the contours of the CT image, but the invention is not limited to this. It is possible to combine any two of the CT image, MRI image, and PET image as a pair, use one for the contours, and use the other for the tissue images rearranged on the same. This also falls within the technical scope of the present invention.

Figure 4:
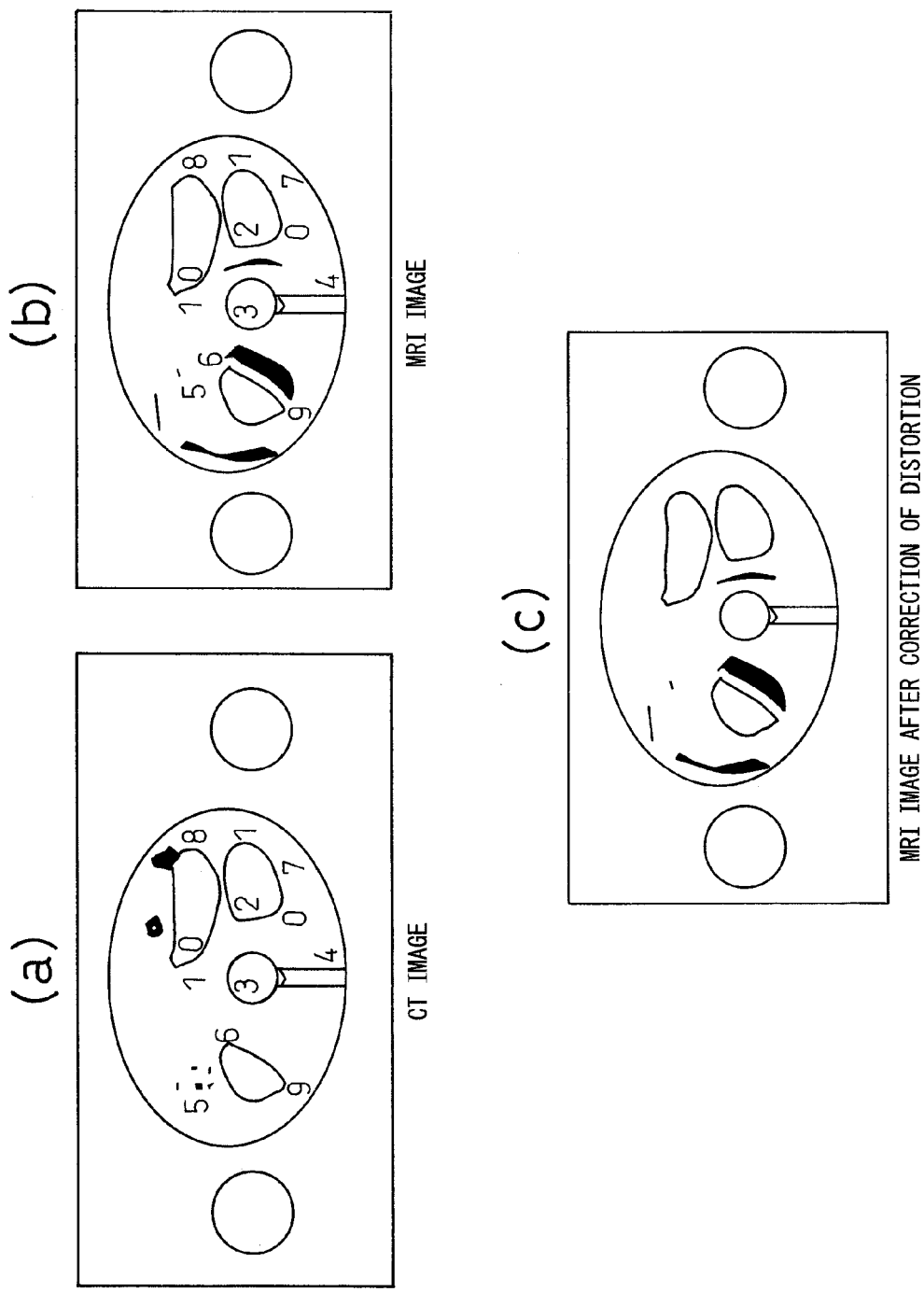
FIG. 4 is a view for explaining an example of rearrangement of tissue images of an MRI image at contours obtained by a CT image.

The operator sets a plurality of features designating the same locations from a displayed CT image and MRI image (FIG. 3, process P302). The computer, by the setting of the features, displays the features on the two image screens with designation numbers attached. The features are set by observing the images based on the expert knowledge and experience as a doctor. Sharp angled parts of the bones and tissues are linked as features as sets with individual points on the two screens (FIGS. 4(a) and 4(b)). The feature group storage unit 203 stores the feature coordinates of the screens corresponding to the numbers of the features which the operator designates.

The polynomial group setting unit 204 reads out from the feature group storage means 203 the feature coordinates x, y in the CT image and the feature coordinates u, v in the MRI image and enters them, for each feature, for example, for each designated number, into the projection transforms $$u=(a_1x+a_2y+a_3)/(a_7x+a_8y+1)$$

$$v=(a_4x+a_5y+a_6)/(a_7x+a_8y+1)$$

(FIG. 3, process P303). The conversion coefficient calculator 205 uses the least square method to derive the conversion coefficients $a_1$ to $a_8$ from the group of polynomials set by the polynomial group setting unit 204 (FIG. 3, process P304). There are eight conversion coefficients $a_1$ to $a_8$. Eight or more equations are established and solved to derive the conversion coefficients $a_1$ to $a_8$. Two equations stand for each set of features, so a minimum of four sets of features becomes necessary.

The contour correction unit 206 uses projection transforms into which the conversion coefficients $a_1$ to $a_8$ which the conversion coefficient calculator 205 calculated were entered so as to find coordinates of the corresponding CT image for an MRI image which is displayed on the second image display device 202 and performs rearrangement by linear interpolation to correct distortion of the image (FIG. 3, process P305). Due to the rearrangement, the positions of the MRI image corresponding to the CRT image are calculated and arranged. Due to this processing, it is possible to obtain a cross-section of the live body, for example, an image comprised of contours of the torso part matched with the contours obtained by the CT image (FIG. 4(c)). The image corrected in contours is stored in the distortion corrected image storage unit 207.

Next, the technique for extraction (segmentation) of organs of the human body will be explained below. That is, a point inside an extraction target region (target point) is designated, similarity of the target point with nearby pixels is judged, and pixels judged similar are incorporated so as to expand the similarity region with the target point and extract the target region. This is an image region extraction method called the "region growing method". This is improved so that in the judgment of similarity, (1) the already obtained information of the positions and pixel values of extraction target regions and non-extraction regions are used as teaching data of judgment, (2) only information of the local region near the target point is used for judgment, and (3) the medians are used for judgment criteria to extract target regions from the 3D body data.

Here, the reason for using only information of a local region will be explained. The region growing processing generates an evaluation criteria (threshold value) of the region expansion while assuming the feature distribution in the entire region is a regular distribution. In the body volume data, the assumption that the feature distribution of the image follows a regular distribution does not necessarily hold, so in the extraction of the target region, it is necessary to establish a local evaluation criteria. To generate this evaluation criteria, only information of the local region is used.

Figure 5:
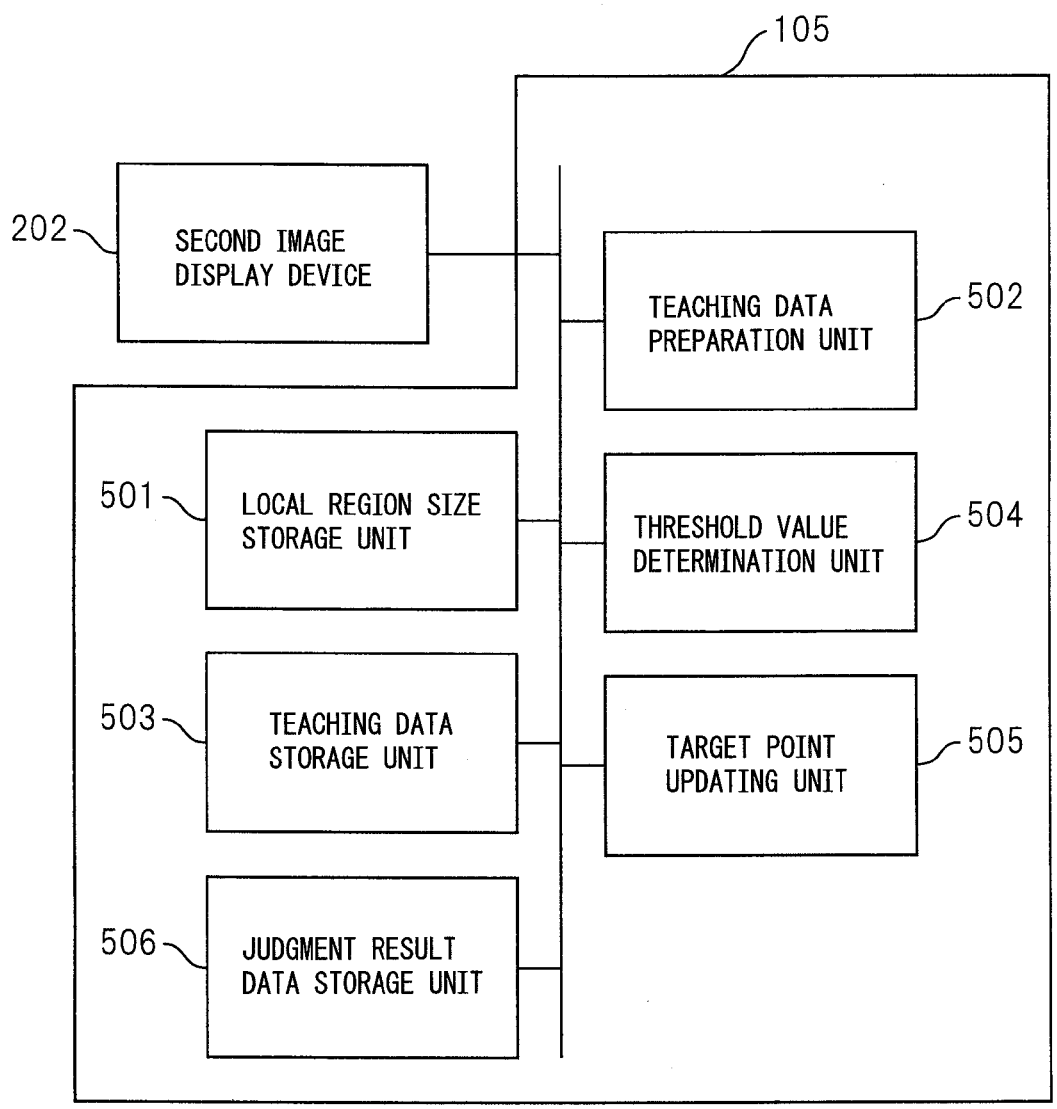
FIG. 5 is a functional block diagram which illustrates part of an example of a segmentation unit.
Figure 6:
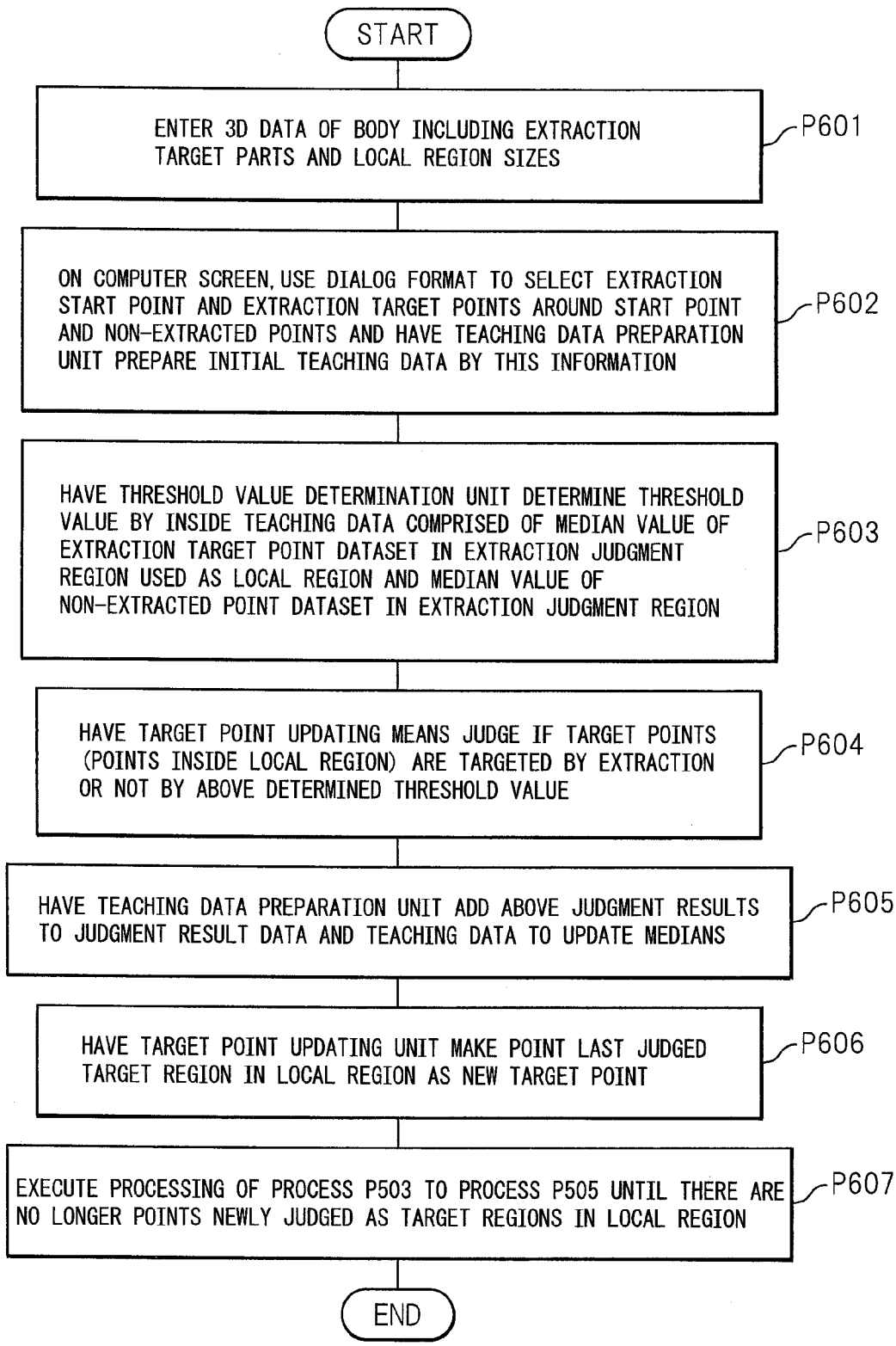
FIG. 6 is a flowchart for explaining the operation and function of an example of a segmentation unit.

FIG. 5 and FIG. 6 are a functional block diagram and flowchart for explaining the operation and function of an example of the segmentation unit 105.

An MRI image corrected for distortion by the contour correction unit 206, that is, medical image data comprised of 3D data of the human body including the extraction target part, is input and is displayed on the second image display device 202. The operator examines the screen, designates the local region of an organ as the part to be extracted (=extraction judgment region) on the screen, and inputs the size of the local region (pixel size in width, height, and depth of local region) in the local region size storage unit 501 (FIG. 6, process P601). The size of the local region can be set and changed for each extraction processing.

The teaching data preparation unit 502 selects an extraction start point and extraction target points around the start point and non-extracted points on a computer screen, that is, second image display device 202, by a dialog format. This information is used as initial teaching data in the form of "1: inside region, −1: outside region, 0: not yet processed" in the data array in which the extraction results are written (FIG. 6, process P602). This data is stored in the teaching data storage unit 503.

The threshold value determination unit 504 uses the extraction start point as the initial target point and uses teaching data, inside the local region centered around that point, comprised of the median value of the extraction target point dataset in the extraction judgment region as the local region and the median value of the non-extracted point dataset in the extraction judgment region so as to determine the threshold value (FIG. 6, process P603). The threshold value at this time is determined by the following equation.

$$\text{Threshold value}=((\text{med}T+\text{med}F)/2)\cdot(1-\alpha)$$

where, $\alpha$: shift value, medT: Median value of extraction target point dataset (pixel value) in extraction judgment region medF: Median value of non-extracted point dataset (pixel value) in extraction judgment region The shift value $\alpha$ ($0\leq\alpha\leq1$) shows the extraction strength. If making $\alpha=0$ the default value and setting $\alpha$ large, the extraction conditions become laxer and the number of extracted pixels increases compared with the time of the default value. The smaller the value, the tougher the extraction conditions and the less the number of extracted pixels. By using the median values, in the extraction judgment, there is no effect due to rapid changes in the features of the image (difference in pixel values) and adjoining already extracted regions.

The target point updating unit 505 uses the threshold value which the threshold value determining means 504 determines to judge if target points (0: unprocessed points in the local region or all points in the local region) should be targeted for extraction or not (whether or not they are points included in an organ for extraction) (FIG. 6, process P604). Furthermore, the target point updating unit 505 adds the results to the judgment result data storage unit 506 and teaching data storage unit 503 (FIG. 6, process P605) for use for further determination of the threshold value by the threshold value determination unit 504. Further, the target point updating unit 505 makes the last point judged to be a target region inside the local region a new target point (FIG. 6, process P606).

In the local region centered on that point, the processing of the process P603 to the process P605 of FIG. 6 is performed until there are no longer any points newly judged to be target regions inside the local region (FIG. 6, process P607). For one organ to be extracted, one image is judged finished being processed when there is no point which is newly judged to be a target region inside the local region. This processing is performed for a plurality of slice images successively obtained for a predetermined range in the height direction of the backbone. The same processing is performed when extracting other organs.

Next, an example of the technique for modifying the 3D image data of the extracted target part, obtained by the target point updating unit 505 of the segmentation unit 105, for each slice image by using a GUI to manually add or delete extracted parts and overlay parts selected for each slice so as to output 3D image data in line with the state of simulation will be explained.

Figure 7:
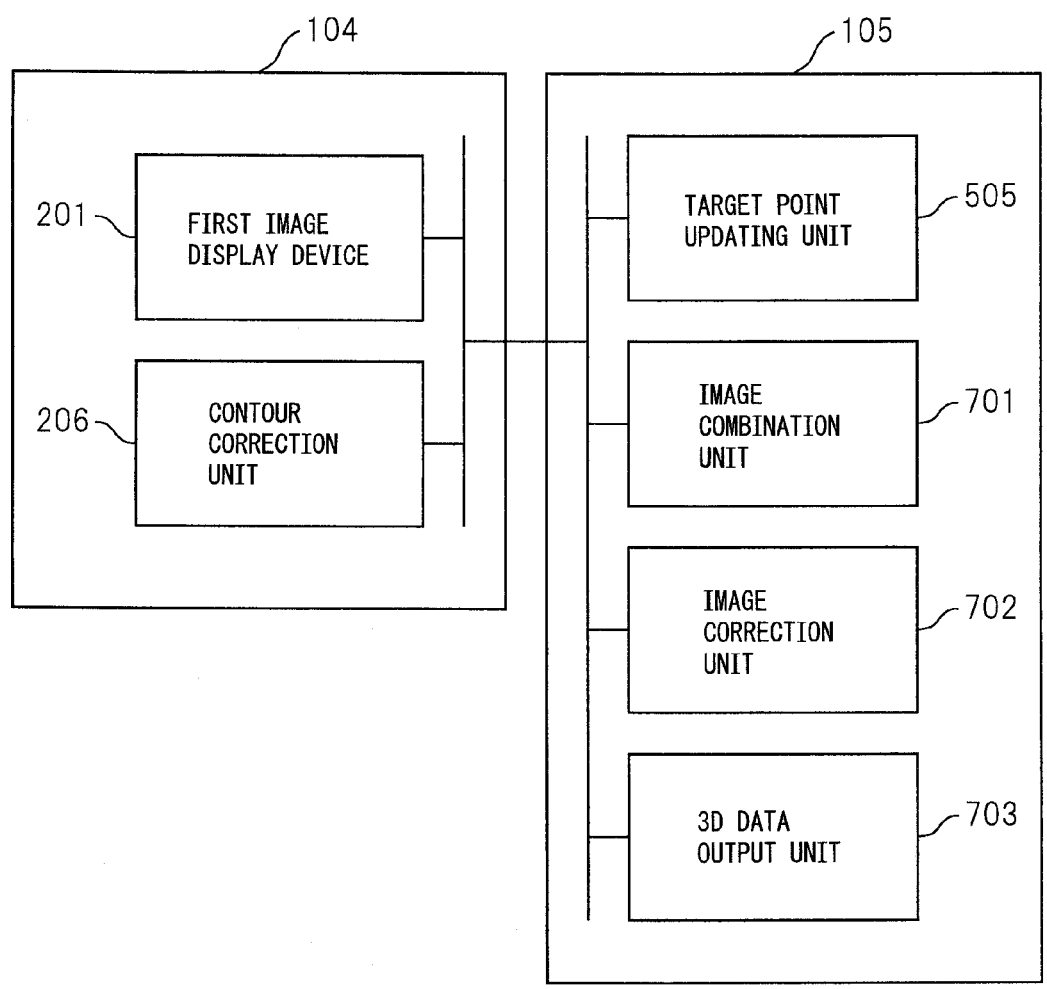
FIG. 7 is a functional block diagram which illustrates part of an example of a segmentation unit.
Figure 8:
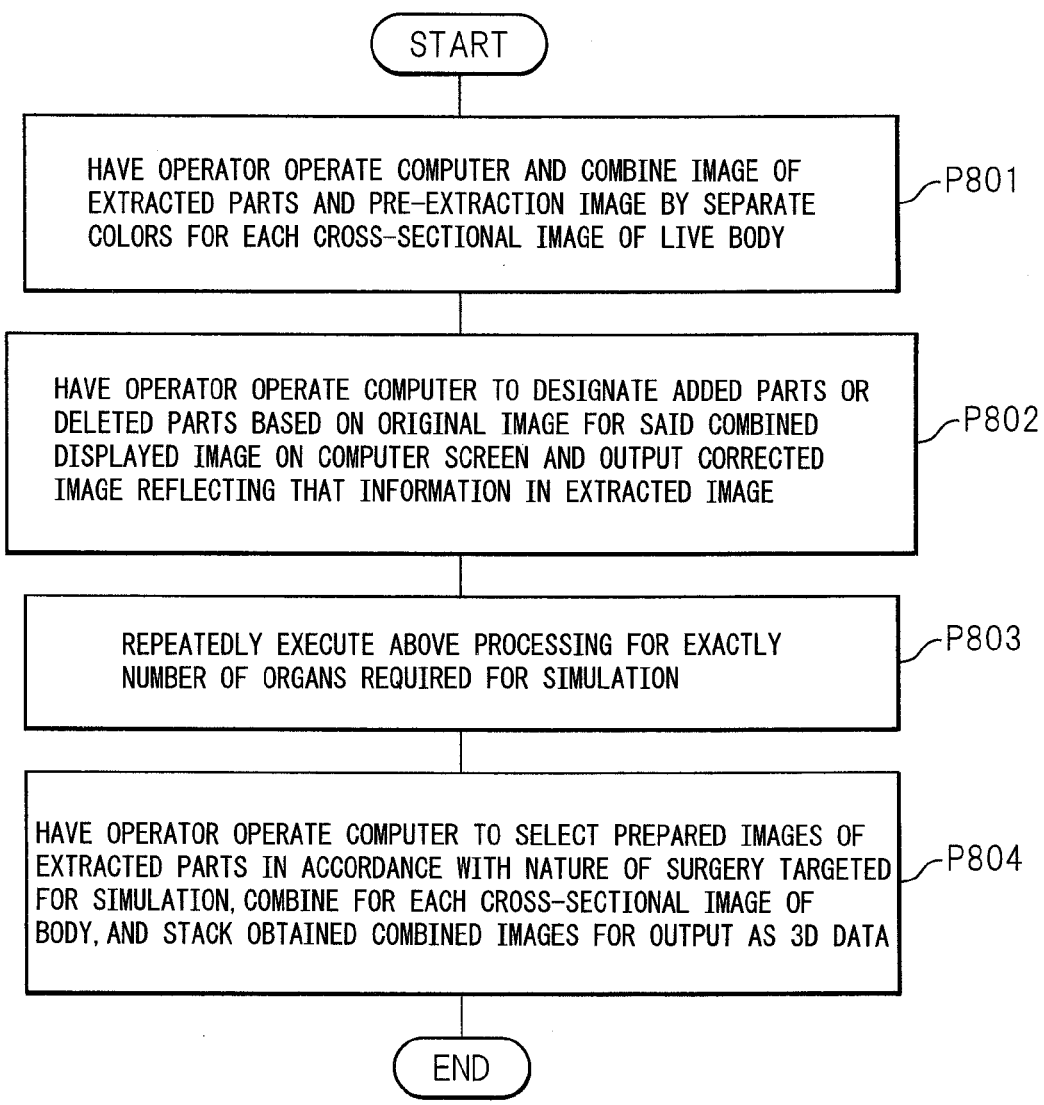
FIG. 8 is a flowchart for explaining the operation and function of an example of a segmentation unit.
Figure 9:
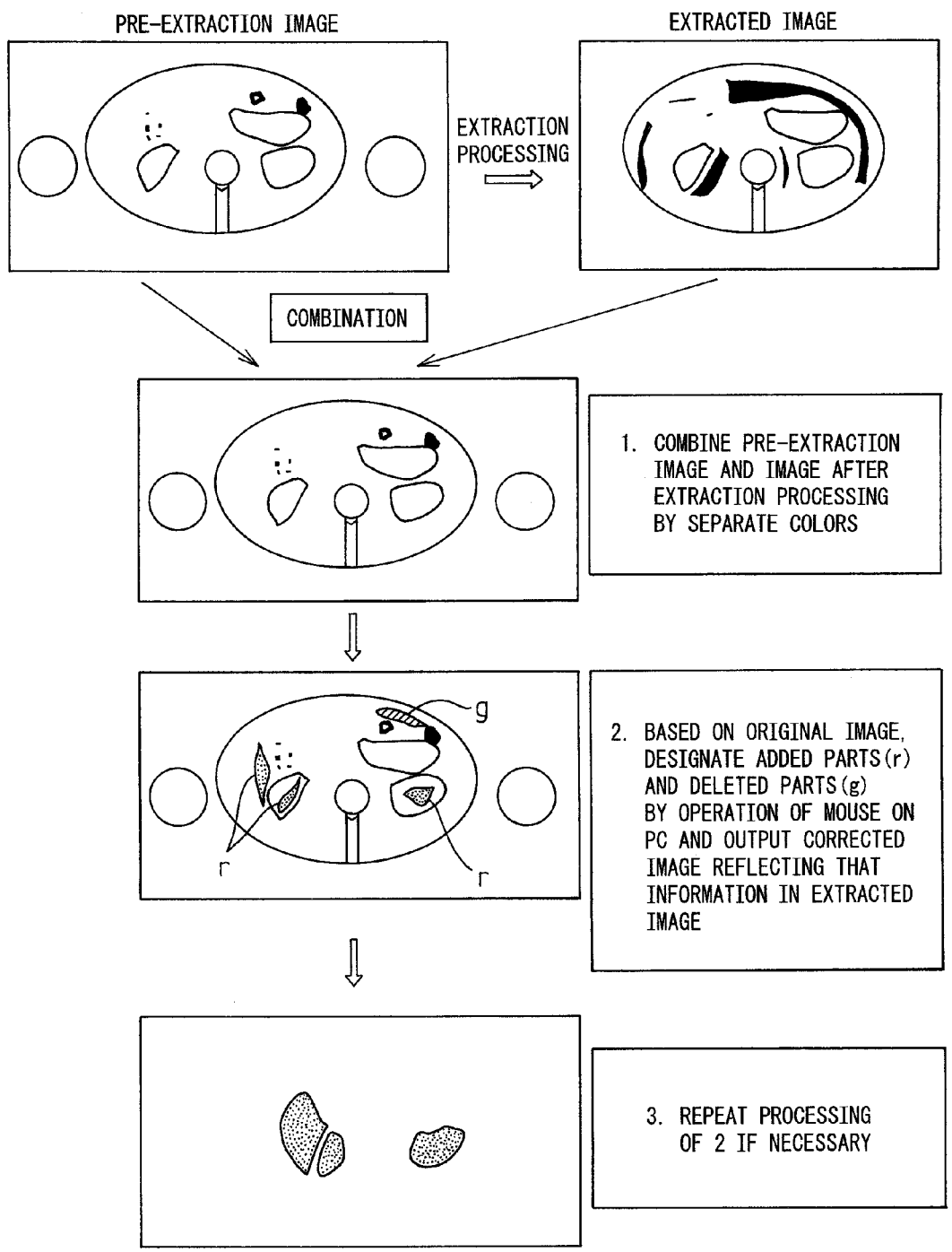
FIG. 9 is a view for explaining an example of extracted image correction processing by manual settings.
Figure 10:
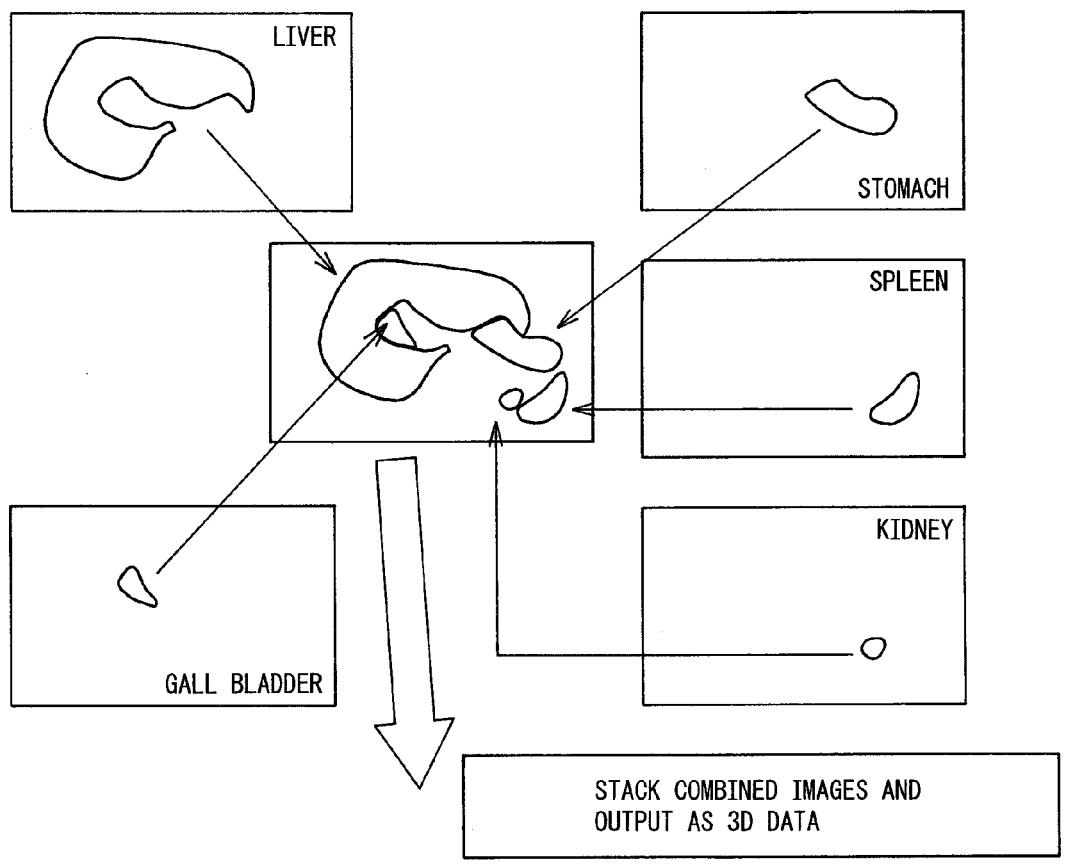
FIG. 10 is a view for explaining an example of combination of extracted parts in slice image units.

FIG. 7 is a functional block diagram, FIG. 8 is a flowchart, FIG. 9 is a view explaining extracted image correction processing by manual settings, and FIG. 10 is a view explaining combination of extracted parts in slice image units. The functional blocks of FIG. 7 are included in the segmentation unit 105.

The operator designates a predetermined range of slice images, uses the image combining unit 701 to combine slice images of the same positions in the height direction of the backbone of the body, that is, slice images obtained by the extracted image data which was output from the target point updating unit 505, and pre-extraction images before extraction obtained from the distortion-corrected image storage unit 206, that is, the contour-corrected slice images, by separate colors so as to enable the two to be visually differentiated (FIG. 8, process P801). This combined image is, for example, displayed on the first image display device 201 (see FIG. 9). The operator can view this screen.

The image correction unit 702 designates an added part by for example red or a deleted part by for example green by a mouse based on the original image for an image which is combined by the image combining unit 701 and which is displayed on the first image display device 201 and outputs a corrected image reflecting the added and deleted information in the extracted image (FIG. 8, process P802). This addition is for supplementing the extraction when there is an omission of extraction in the processing of the process P601 to the process P607. This addition processing is performed in the same way as the processing of the process P601 to the process P607. Further, designation of deleted parts and corrections thereof are made for correcting the case of excessive extractions. Deletion is performed by rewriting result information showing the extraction target, which is recorded in the judgment result data storage unit 506 for the target point for a part to be deleted, by information showing it is not an extraction target.

The processing of the process P802 of FIG. 8 is performed repeated for a number of times corresponding to the number of organs required for simulation (FIG. 8, process P803).

The 3D data output unit 703 selects a plurality of images of extracted parts, which the image correction unit 702 prepared, in accordance with the nature of the surgery targeted by the simulation, combines them for each cross-sectional image of the live body, and stacks the obtained combined images for output (FIG. 8, process P804, FIG. 10). By combining and stacking only the organs required for simulation, 3D data of the model to be constructed is obtained (see FIG. 10). As explained above, the extraction processing is performed for one type of organ or tissue. The model used for the simulator usually has a plurality of parts, so separately extracted parts are combined. For the model, for example, when considering constructing a model of the vicinity of the kidneys, the kidneys, renal arteries, renal veins, and membranes around the kidneys may be considered. These are extracted, straightened up (pixels added and deleted), then are combined to prepare 3D data for preparing a data model. In addition, it becomes possible to construct a model meeting the requirements of the different diagnostic departments of hospitals (neurosurgery, cardiosurgery, etc.)

Next, an example of the technique for introducing physical information (Young's modulus, Poisson ratio, etc.) corresponding to the sensor values, for example, CT values and MRI values in a biodata model will be explained.

Figure 11:
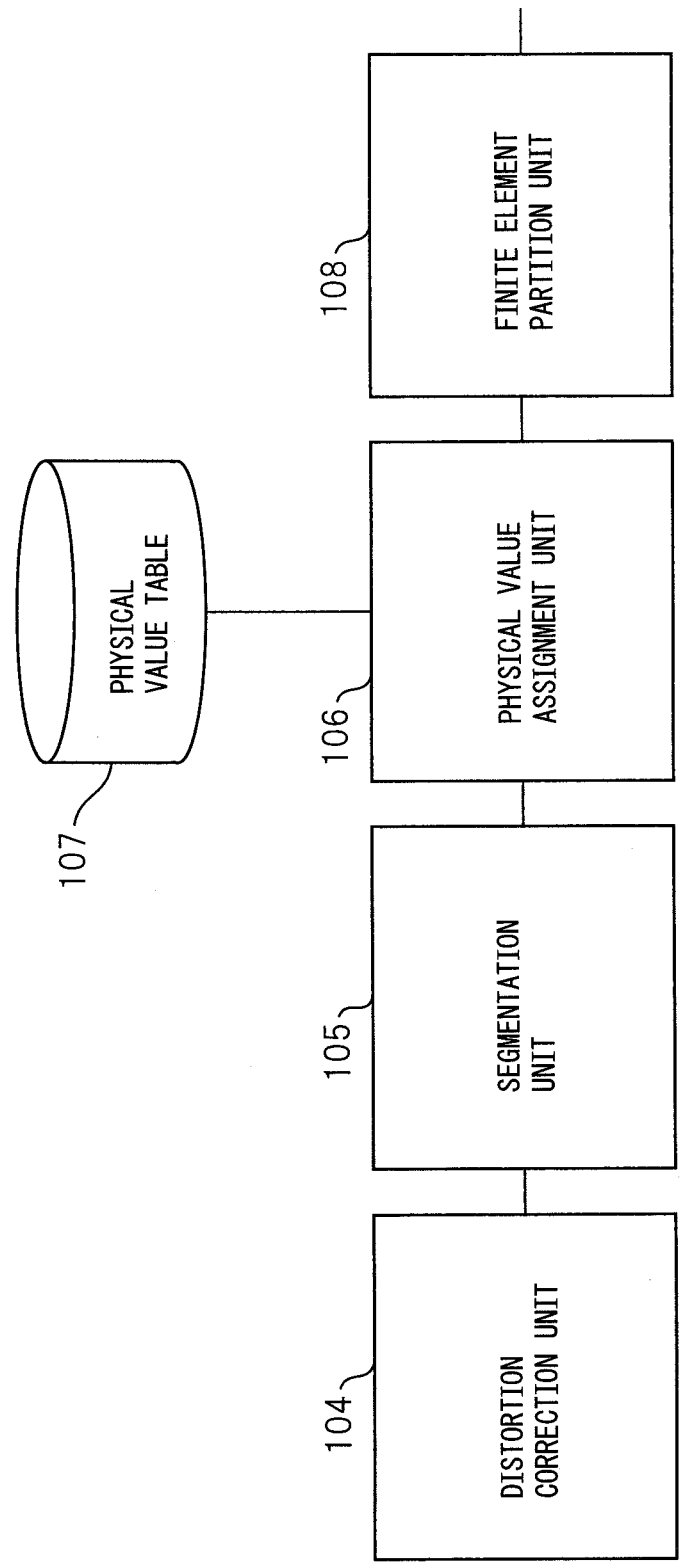
FIG. 11 is a functional block diagram for explaining an example of assignment of physical information based on sensor values.
Figure 12:
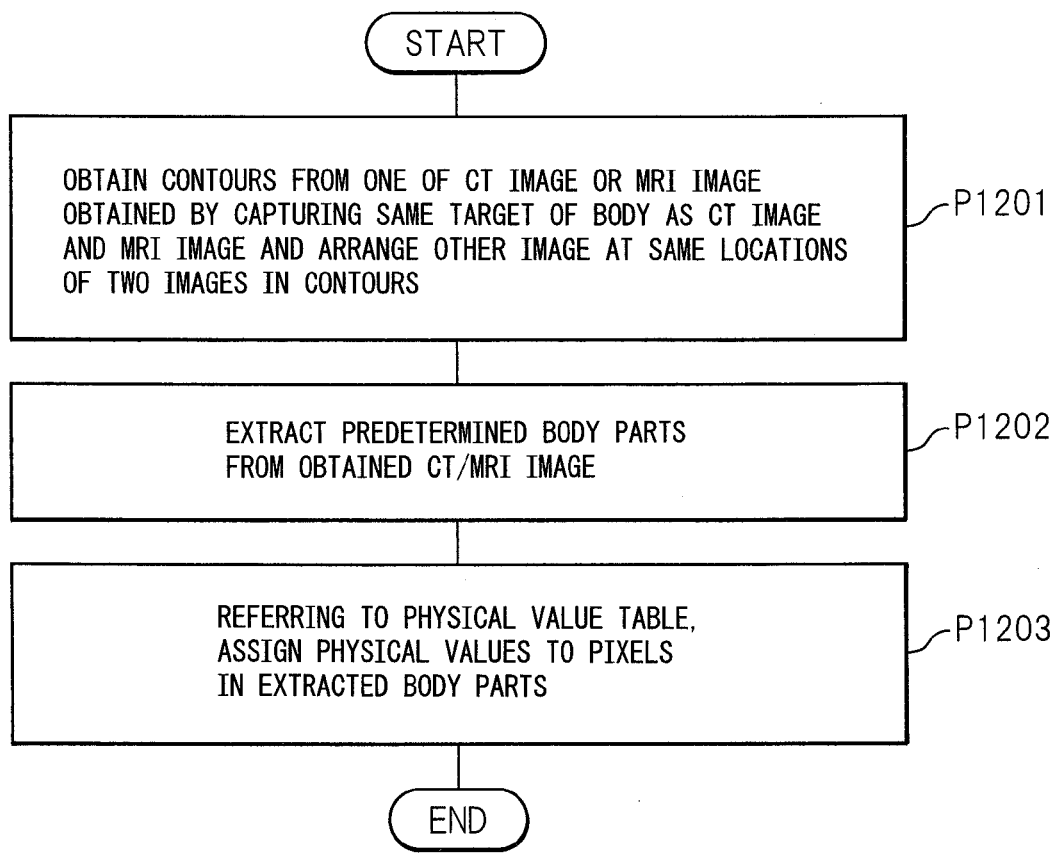
FIG. 12 is a flowchart for explaining an example of assignment of physical information based on sensor values.
Figure 13:
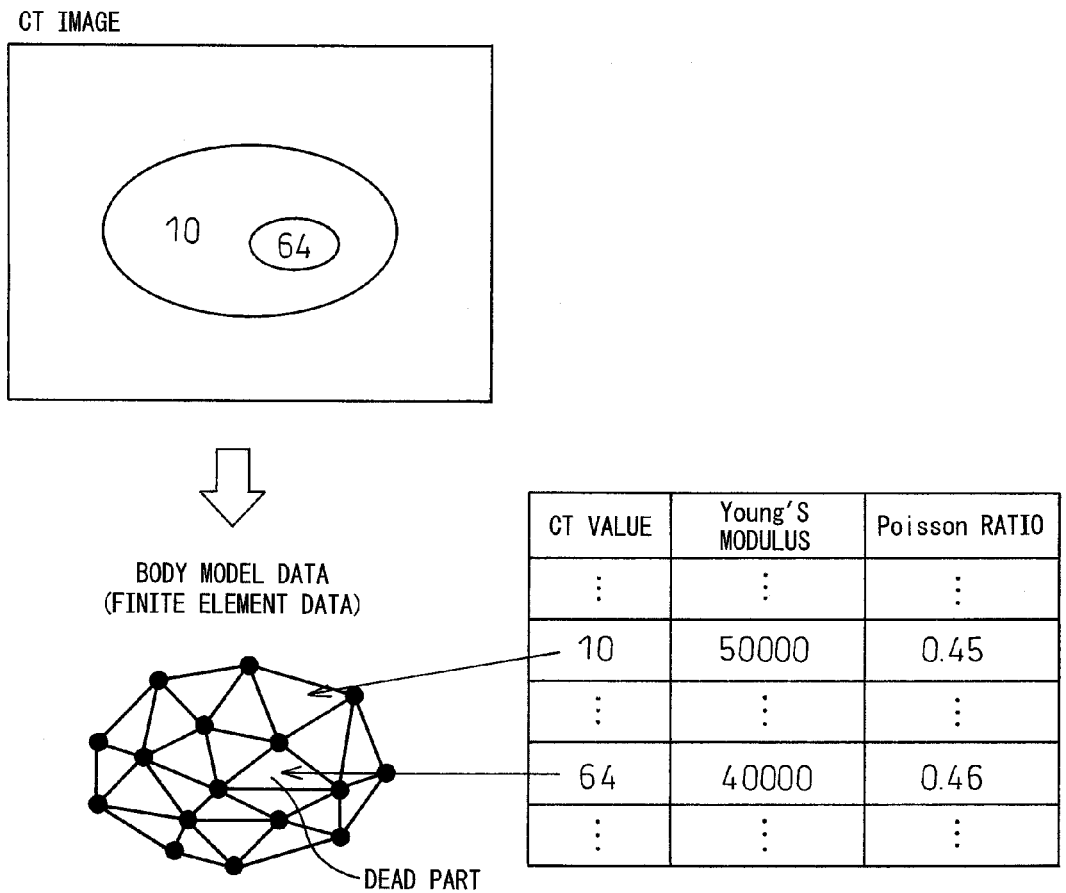
FIG. 13 is a view of the configuration for explaining an example of assignment of physical information based on sensor values.

FIG. 11 is a functional block diagram for explaining the operations and functions, while FIG. 12 is a flowchart for explaining the operations and functions. FIG. 13 is a view for explaining the configuration.

The distortion correction unit 104, as already explained, obtains the contours from one of the CT image or MRI image which was obtained by capturing the same target of the live body as a CT image and MRI image and arranges the other image in the contours while linking the same locations of the two images (FIG. 12, process P1201). The segmentation unit 105, as already explained, extracts the body parts from the obtained CT/MRI image (FIG. 12, process P1202). The pixels of the CT/MRI image have CT and MRI values. The physical value assignment unit 106 refers to the physical value table 107 to convert the CT values/MRI values to physical values. The physical value table 107 stores the relationship between the CT values/MRI values with physical values in the form of a lookup table. By referring to this, the pixels of the body parts which are extracted are given physical values (FIG. 12, process P1203, FIG. 13).

At this time, the physical value table includes information defining the nature of damage corresponding to an envisioned simulation. For example, when considering a kidney model, assume that part of the kidney has died. The technique of bioextraction which was explained using the above-mentioned FIG. 5 and FIG. 6 is applied to the dead part and physical values corresponding to a dead state are assigned to that region. Note that, the dead part and not dead part of the same kidney are combined by the technique which was explained with reference to FIG. 7 and FIG. 8 to reproduce a single kidney.

Next, when generating a biodata model from volume data in the finite element partition unit 18, an example of the technique of considering the processing load, controlling the scale of the model data, and maintaining the shape precision will be explained.

Figure 14:
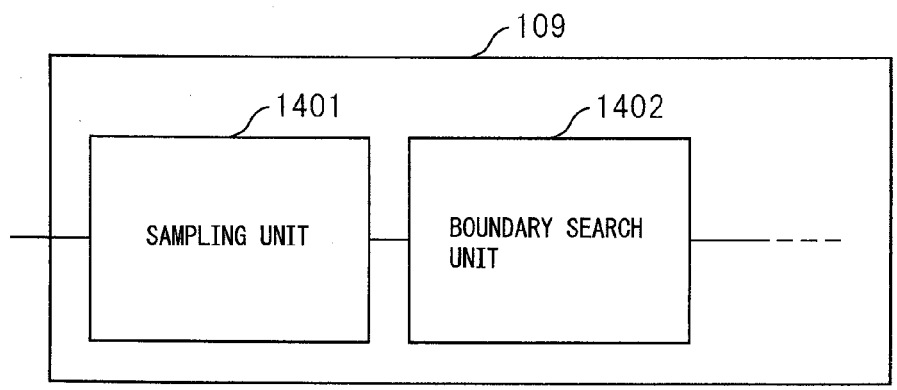
FIG. 14 is a functional block diagram of a part of a an example of preprocessing unit.
Figure 15:
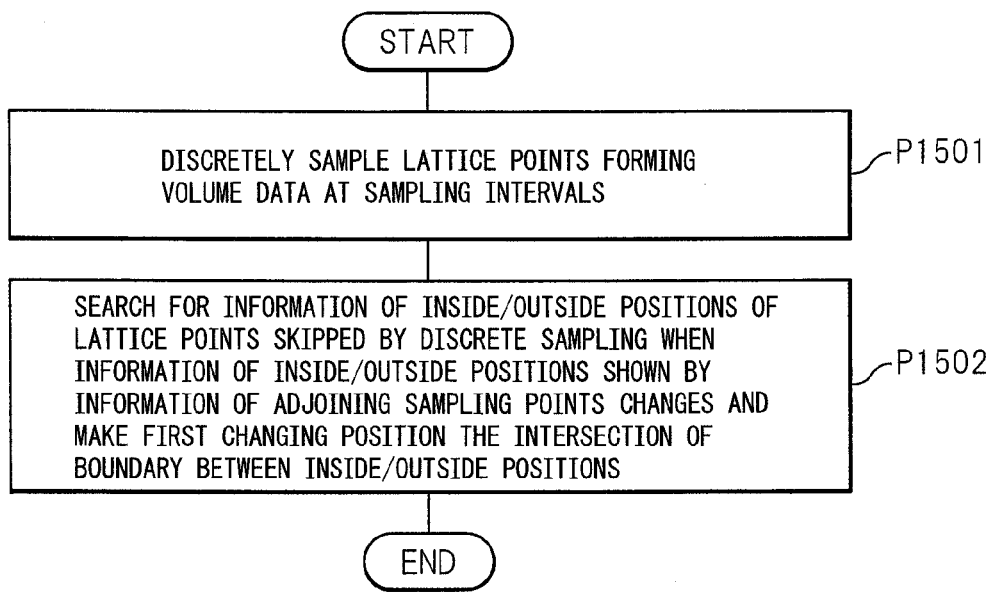
FIG. 15 is a flowchart for explaining a sampling operation of an example of a preprocessing unit.
Figure 16:
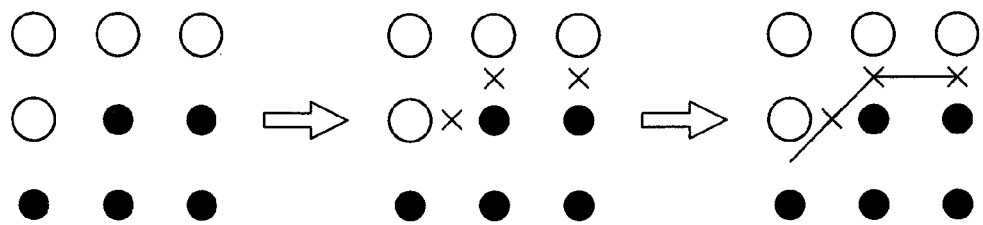
FIG. 16 is a view for explaining a Marching Cubes method.
Figure 17:
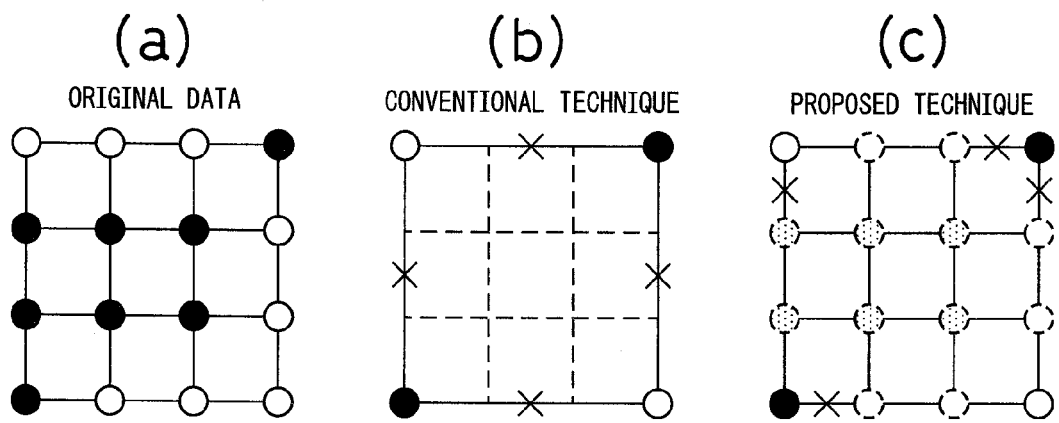
FIG. 17 is a view for explaining an isosurface determination rule along with differences from the conventional method.

FIG. 14 is a functional block diagram, FIG. 15 is a flowchart, FIG. 16 is a view for explaining the Marching Cubes method, and FIG. 17 is a view for explaining the isosurface determination rule of the present invention along with differences from the conventional method.

The preprocessing unit 109 uses the Marching Cubes method to generate the surface of a biomodel and uses the octree method or other known technique to generate a tetrahedron mesh of the inside.

The volume data is 3D data which is generated from a CT image and an MRI image. Like with the pixels of the image, it is information, also called voxels, regularly arranged in a lattice in 3D directions. As opposed to this, the data expressing a body part by a set of tetrahedron elements is a biomodel.

Here, a summary of the Marching Cubes method will be explained with reference to FIG. 16. This technique finds boundaries for a certain threshold value for the volume data which is generated by segmentation and displays the results by polygons. The volume data, as explained above, is information of the points which are regularly arranged in a lattice (in FIG. 16, the black dots indicate points outside the region of the live body, while the white dots indicate points inside the region of the live body). From information of the adjoining points, boundary lines (since considering 3D, boundary planes) are generated (formed by lines connecting (x) marks in FIG. 16). The output, that is, the boundary lines, form polygons of the surface forming contours of the generated regions.

The sampling unit 1401 receives as input the extracted image data generated by the segmentation unit 105 and discretely samples the lattice points forming the volume data at predetermined sampling intervals (FIG. 15, process P1501).

If the sampling unit 1401 samples the data at intervals of three lattice points, by applying the conventional technique to the original data shown in FIG. 17(a), as shown in FIG. 17(b), a boundary plane passing through the center points between the sampled lattice points is generated. As opposed to this, in the present embodiment, as shown by FIG. 17(c), the boundary plane is determined considering also the values of the not sampled lattice points. This sampling interval can be changed for adjusting the mesh size.

The mesh size is the number of tetrahedron elements of the biomodel. For the same data, the larger the mesh size, the more detailed the model, but the greater the amount of processing by that amount. With the Marching Cubes method, the resolution of the input volume data and the output biodata model mesh size, that is, the magnitude of the number of tetrahedron elements, are basically proportional. If the size of the volume data is large (resolution is high), since the tetrahedrons are generated based on that, more detailed tetrahedrons (mesh) are generated (that is, the mesh size becomes larger). Conversely, if the size of the volume data is small (resolution is low), the mesh size also becomes smaller. A model should be as detailed as possible, but if the mesh size is too large, processing is no longer possible in real time, so when using high resolution volume data, it is necessary to make data which has been lowered in resolution to a certain extent the input data. For example, if making the sampling interval "2" for 512×512 data, data reduced in resolution by skipping every other bit of data is generated. In this way, the resolution of the input volume data is lowered in advance to adjust the mesh size.

The boundary search unit 1402 searches for information of the inside/outside positions of the lattice points which are skipped by discrete sampling when the information of the inside/outside positions which is shown by the information of the lattice points which are sampled at the sampling unit 1401 changes and defines the first changing position to be an intersection of a boundary of the inside/outside positions (FIG. 15, process P1502).

Figure 18:
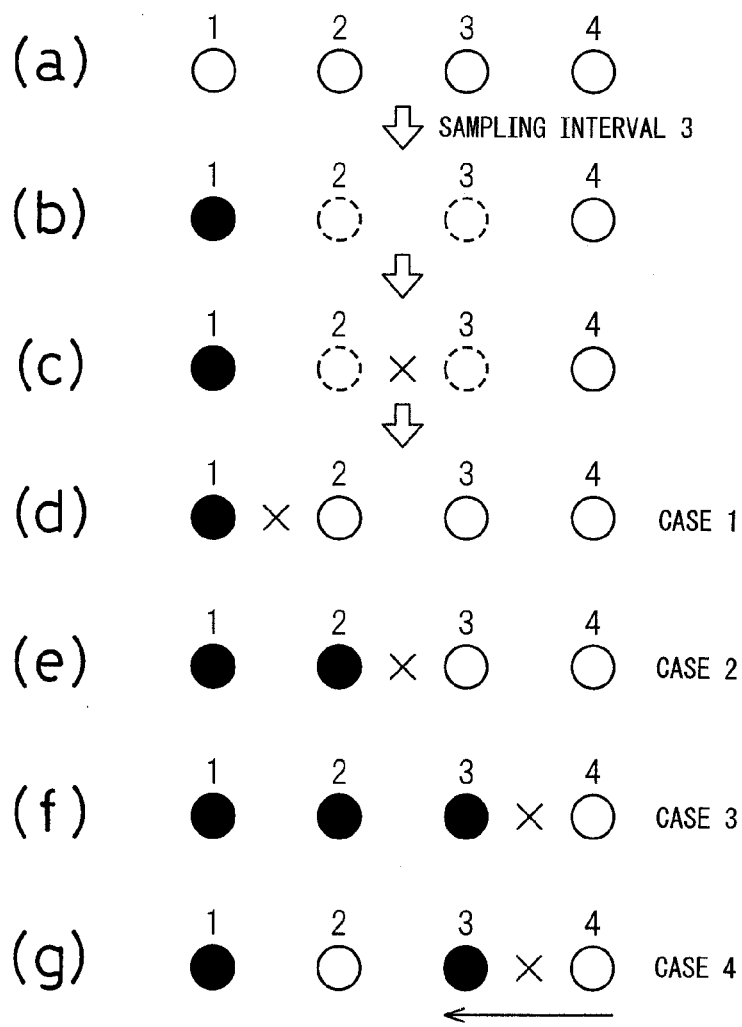
FIG. 18 is a view for explaining an example of determination of the inside/outside positions of lattice points.

For example, in FIG. 18, consider the case of sampling 1 and 4 for judgment of the inside/outside positions and dropping the data of 2 and 3. If both 1 and 4 are inside or outside, nothing is done (FIG. 18(a)). If 1 and 4 are different in sign (FIG. 18(b)), there should be a boundary (body surface) between them, so the intersection between the side (imaginary line connecting lattice points in sampling direction) and boundary is sought. Note that, if stitching together the intersections found in this way, polygon data of the body surface is formed. By the conventional technique, the center point between 1 and 4 was simply used (FIG. 18(c)). In the present invention, when creating an intersection, the information of 2 and 3 skipped by the sampling is used to calculate the intersection. Four cases such as illustrated in FIGS. 18(d) to 18(g) obtained by combining the skipped 2 and 3 may be considered. The information of the successively adjoining lattice points from 4 are compared, whether the signs differ is viewed, and it is judged there is an intersection between lattice points first differing in signs. In the case 4, that is, the case of FIG. 18g, there are intersections at three locations, but if considering intersections at three locations, there is no meaning in skipping in sampling, so the intersection (between 4 and 3) first found in the search direction (direction from 4 to 1) is employed. By doing this, it is possible to raise the precision of intersections without increasing the mesh size.

Note that, in a certain usual Marching Cubes method, the values of the lattice points are not binarized, and for example, at the time of white 10 and black 20, when forming an "isosurface of the threshold value 13", "the point dividing the distance between white and black into 3:7 is made the intersection" and a line (plane) is formed.

Next, an example of the technique, when converting a surface forming the contours of the body region which the boundary search unit 1402 obtains into polygons, of smoothing the vertex positions of the isosurface data by the positions of the surrounding vertices so as to correct the geometric shape of the model data will be explained.

This is predicated on the use of the octree method to generate a tetrahedron mesh of the surface and inside of a body. The tetrahedron mesh which is generated, as is, forms relief shapes at the body surface so great as to give a different impression from the actual body. Therefore, the vertex positions of the isosurface data are smoothed by the positions of the surrounding vertices so as to smooth the shape of the organs at the time of visualization.

Figure 19:
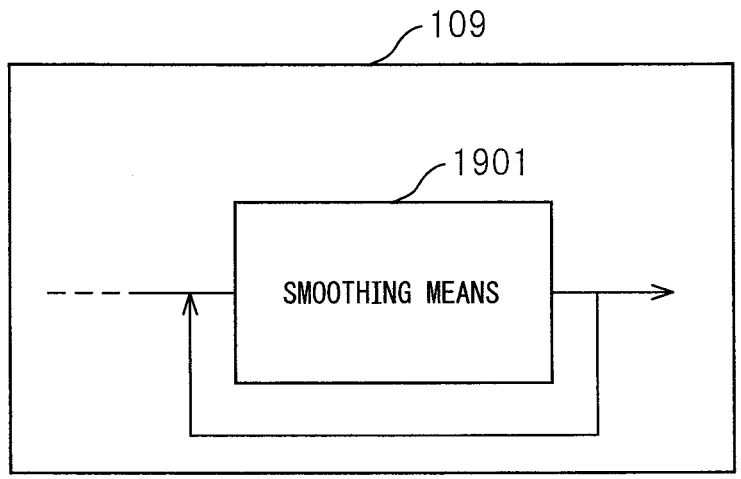
FIG. 19 is a functional block diagram of a part of an example of a preprocessing unit.
Figure 20:
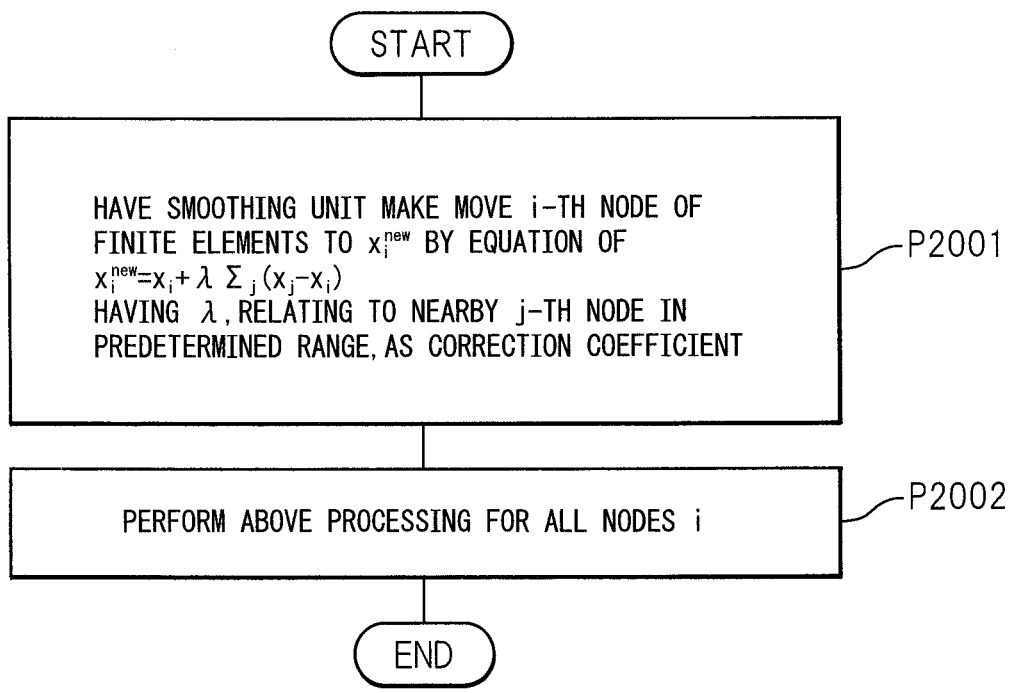
FIG. 20 is a flowchart for explaining an example of smoothing of a preprocessing unit.

FIG. 19 is a functional block diagram, FIG. 20 is a flowchart, and FIG. 21 is a view for explaining smoothing. The smoothing unit 1901 generates a tetrahedron mesh divided by finite elements from the volume data of the isosurface data which is processed and prepared by the boundary search unit 1402 of FIG. 14. At this time, the smoothing part 1901 performs the following processing on the expansion points of the finite elements of the data model. That is, as illustrated in FIG. 21, it corrects a position $x_i$ by the following equation from the relative positions of the i-th node and the nearby j-th node $(x_j-x_i)$ (FIG. 20, process P2001).

That is, the equation for shifting a position $x_i$ of the i-th node to $x_i^{new}$ is:

$$x_i^{new}=x_i+\lambda\Sigma_j(x_j-x_i)$$

where, j is a node near i (in FIG. 21, j=1, 2), and $\lambda$ is a correction coefficient which is suitably determined so that the organ becomes appropriately smoothed. From this equation, when a node is far from the nearby node, the amount of correction is large, while when it is not that far, the amount of correction is small.

If performing the above processing for all nodes i (FIG. 20, process P2002), the nodes are arranged at average positions and as a result the shape as a whole becomes smooth.

Next, an example of the data structure for constructing a tree structure for a biodata model so as to enable fast calculation of contact between organs will be explained.

In dynamic calculation of a biomodel, the calculation of contact between organs is one of the most time consuming processings. If comprehensively performing the calculation of contact between organs, too much time is taken. For example, as illustrated in FIG. 22, when calculating contact of a not structured model, it was necessary to judge contact for all combinations of organs such as between the right kidney and liver, between the left kidney and liver, and between the right kidney and left kidney.

Figure 23:
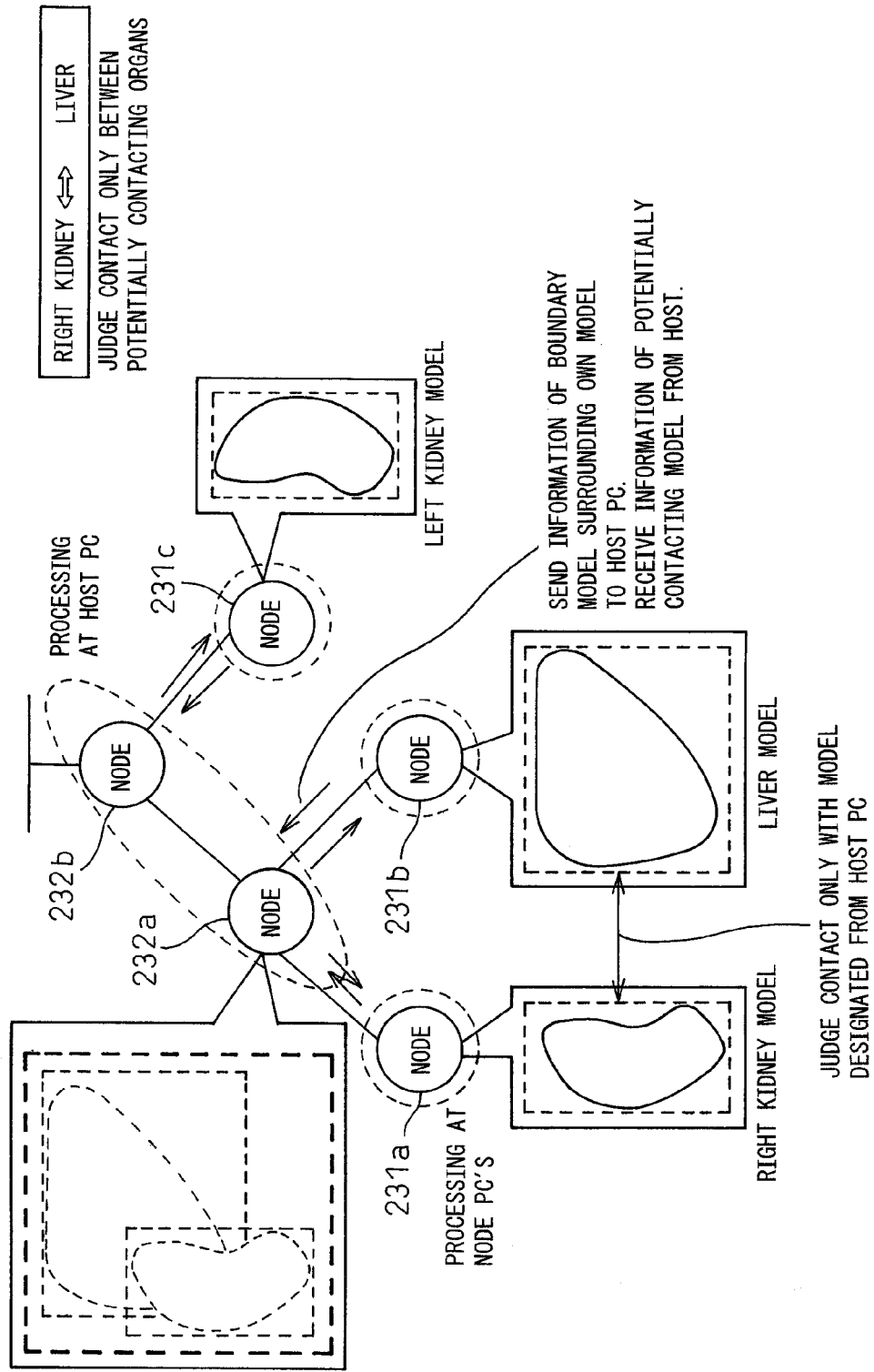
FIG. 23 is a view for explaining an example of a constructed tree structure.
Figure 24:
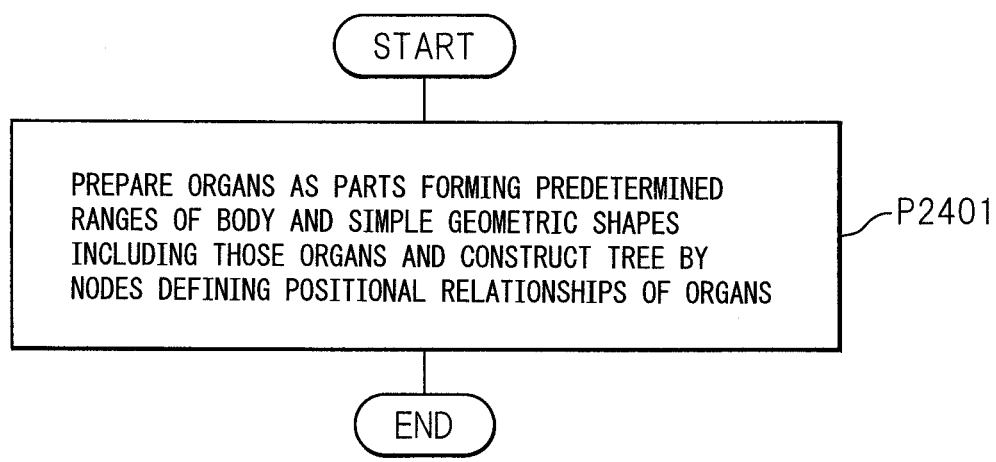
FIG. 24 is a flowchart for explaining an example of construction of a tree structure.
Figure 25:
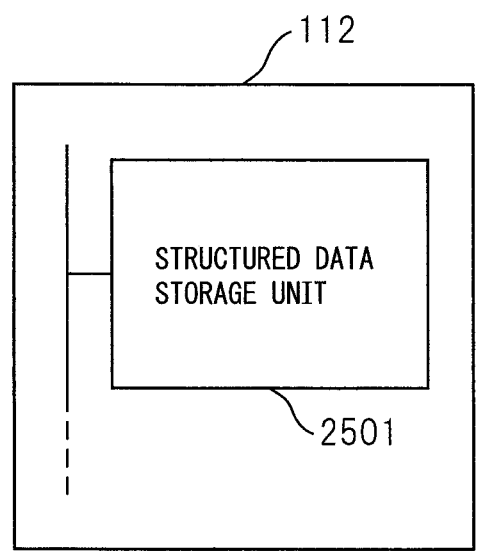
FIG. 25 is a view of an example of a structured data storage unit which stores data constructed in a tree shape.

Therefore, a tree structure such as illustrated in FIG. 23 is constructed for the biodata model. The tree of FIG. 23 has nodes. The nodes include end nodes 231a, 231b, and 231c and connection nodes 232a and 232b connecting these nodes. The end nodes 231a, 231b, and 231c have, as auxiliary data, information on the organ models unique to the nodes as parts forming a predetermined range of the body and geometric models (for example, simple boxes, spheres, etc.) surrounding the organs. The end nodes 231a, 231b, and 231c are assigned node computers which are in charge of motion processing for the nodes. Further, the connection nodes 232a and 232b are assigned the host computer which integrates the processings of the node computers in charge of the end nodes 231a, 231b, and 231c. The nodes 231a, 231b, and 231c respectively have information on the right kidney model, liver model, and left kidney model. The nodes 231a and 231b are arranged close to each other due to the positional relationship of the actual organs and are connected by the connection node 232a. The node computers in charge of the nodes 231a and 231b send the information of the boundary models surrounding the right kidney model and liver model to the host computer which is assigned to the connection node 232a and receive information of the organ models which might be contacted from the host computer. Further, the node computer in charge of the end node 231c sends information of the boundary model surrounding the left kidney model to the host computer in charge of the connection node 232b and receives information of the right kidney and liver model received through the connection node 232a. At this time, the connection node 232a is provided with the right kidney and liver model of the end nodes 231a and 231b to be connected in a combined state in the same way as the auxiliary data of the end nodes, and the nodes are connected in a tree (FIG. 24, process P2401). The data constructed in this tree shape is stored in the structured data storage unit 2501 as illustrated in FIG. 25.

By making the geometric models surrounding the organs simple geometric shapes, at the time of contact judgment, it is possible to perform processing extremely quickly compared with complicated shapes of actual organs. By following the tree and using contact judgment by simple shapes, it is possible to narrow down organs which might be contacted at an early stage and possible to reduce collision calculations.

Figure 26:
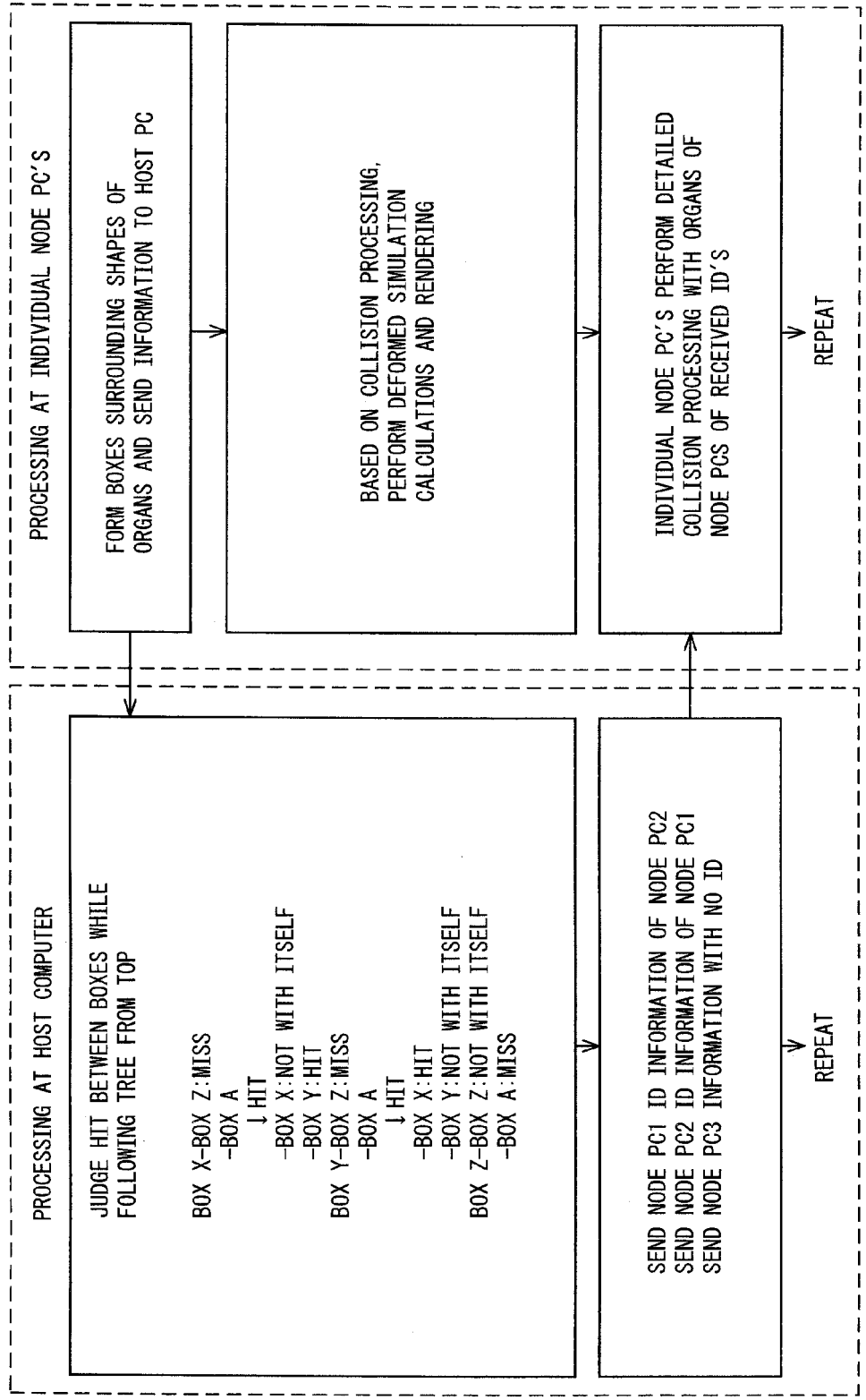
FIG. 26 is a view for explaining an example of contact judgment processing using a tree structure.

The host computer and node computers perform processing in parallel. The host computer uses the tree structure to roughly judge which organs might contact which organs. The information is sent to the computers which are connected to the end nodes 231a, 231b, and 231c. These node computers judge collision with organs of the node computers received (FIG. 26). The host computer performs the above calculations when the node computers perform deformation processing or rendering processing, so the overall processing time is reduced.

Next, an example of the technique for dispersion of the load in accordance with the number of processors designated will be explained.

The processing of the biodata model depends on the number of vertices of the finite elements forming the data. To process data of a large number of vertices, the processing is performed dispersing the load among a plurality of processors. If partitioning the biodata model in just any way to disperse the load, the number of times of communication between the processors would increase.

Figure 27:
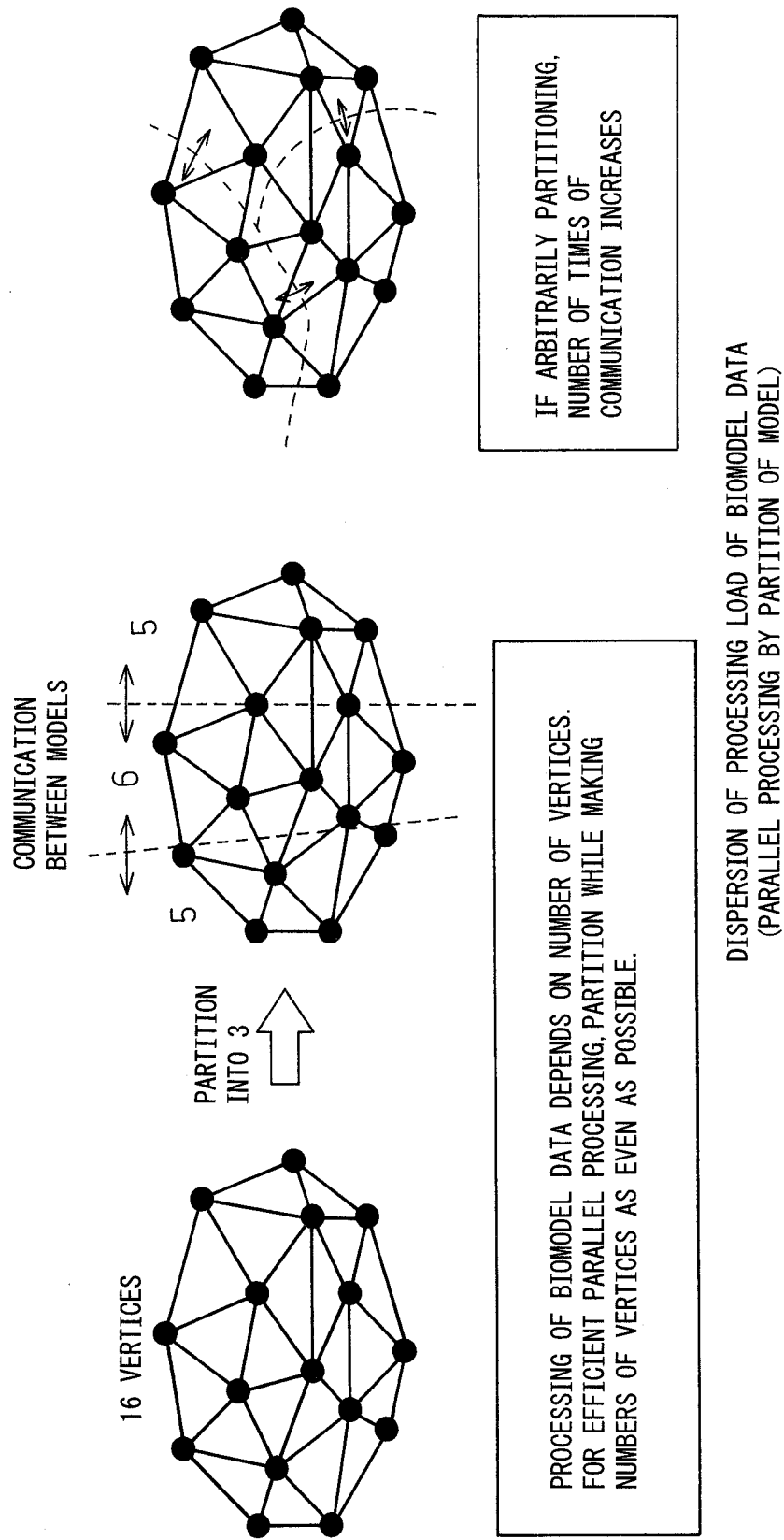
FIG. 27 is a view of one example of partition of a biodata model.
Figure 28:
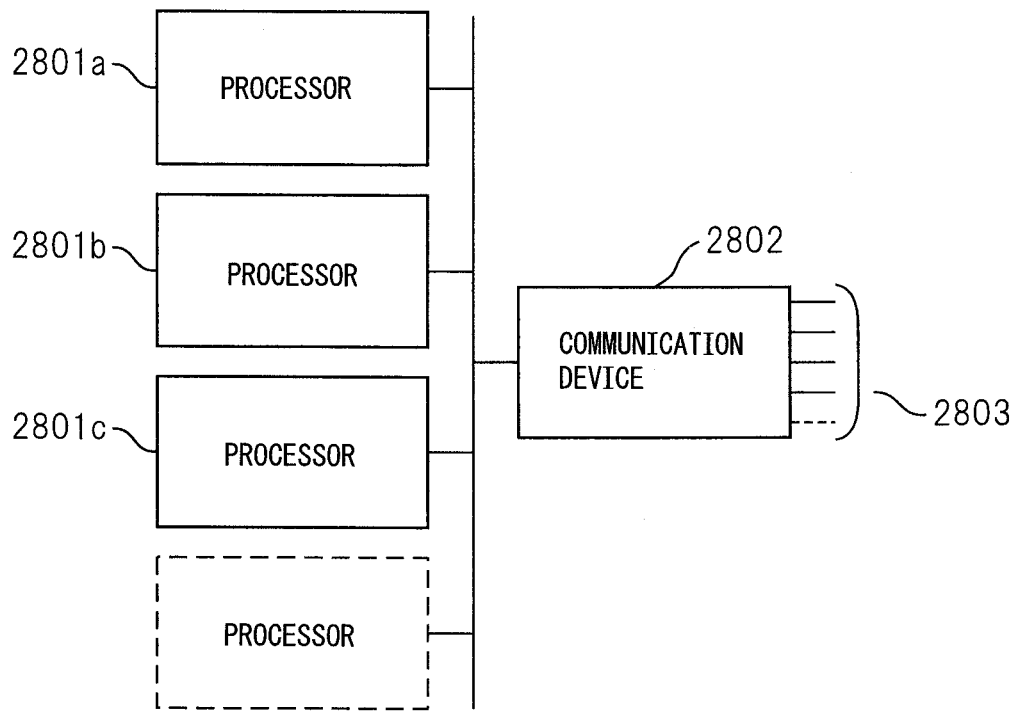
FIG. 28 is a functional block diagram for explaining an example of connections in load dispersion of processing.

Therefore, for efficiently performing parallel processing, the number of vertices of the biodata model is partitioned as evenly as possible. Further, to reduce the frequency of communications, when displaying the biomodel on a monitor screen, the partition planes are prevented from intersecting in the biomodel. FIG. 27 illustrates an example of partition, while FIG. 28 indicates a functional block diagram. Due to this, mutual communication is possible only with the two adjoining partitioned model sections. In FIG. 28, 2801a, 2801b, 2801c . . . indicate processors, 2802 indicates a communication device, and 2803 indicates a communication line.

Figure 29:
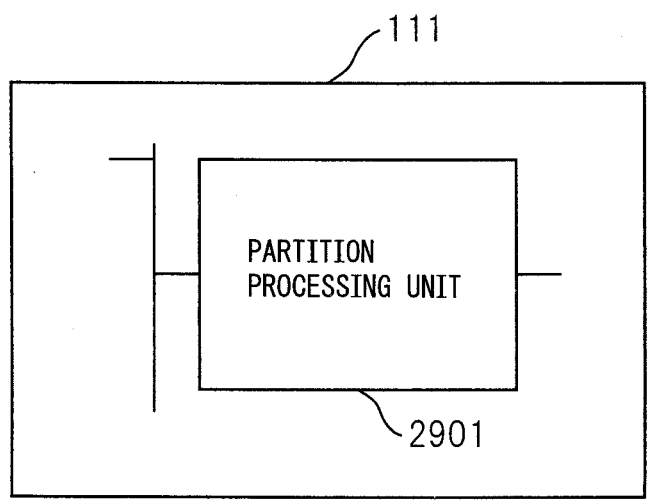
FIG. 29 is a functional block diagram of an example of partition processing.

The algorithm for partition is selected from the following three techniques. A computer program is used as illustrated in FIG. 29 for processing of the partition processing unit 2901 of the computer.

Figure 30:
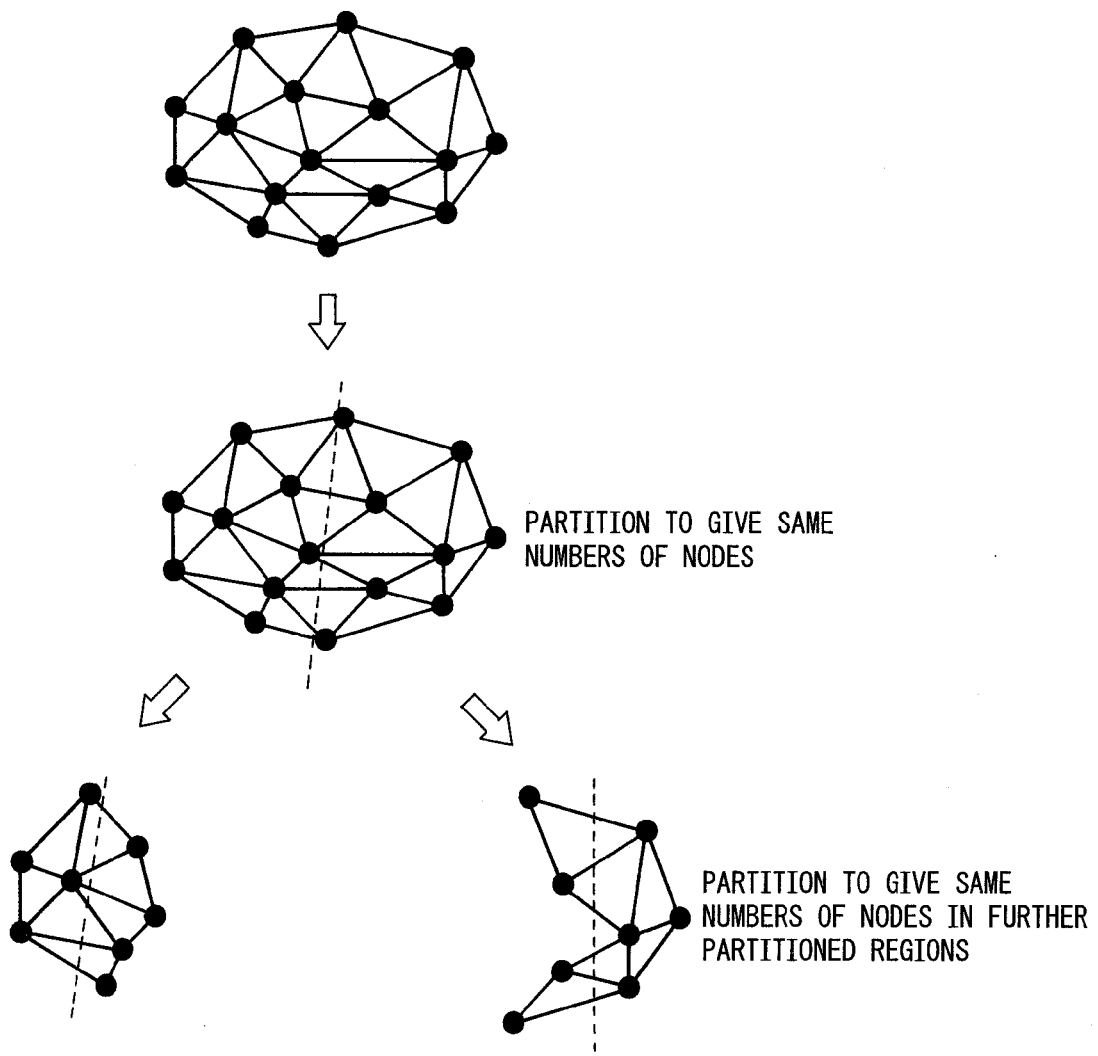
FIG. 30 is a view for explaining an example of the partition processing.
Figure 31:
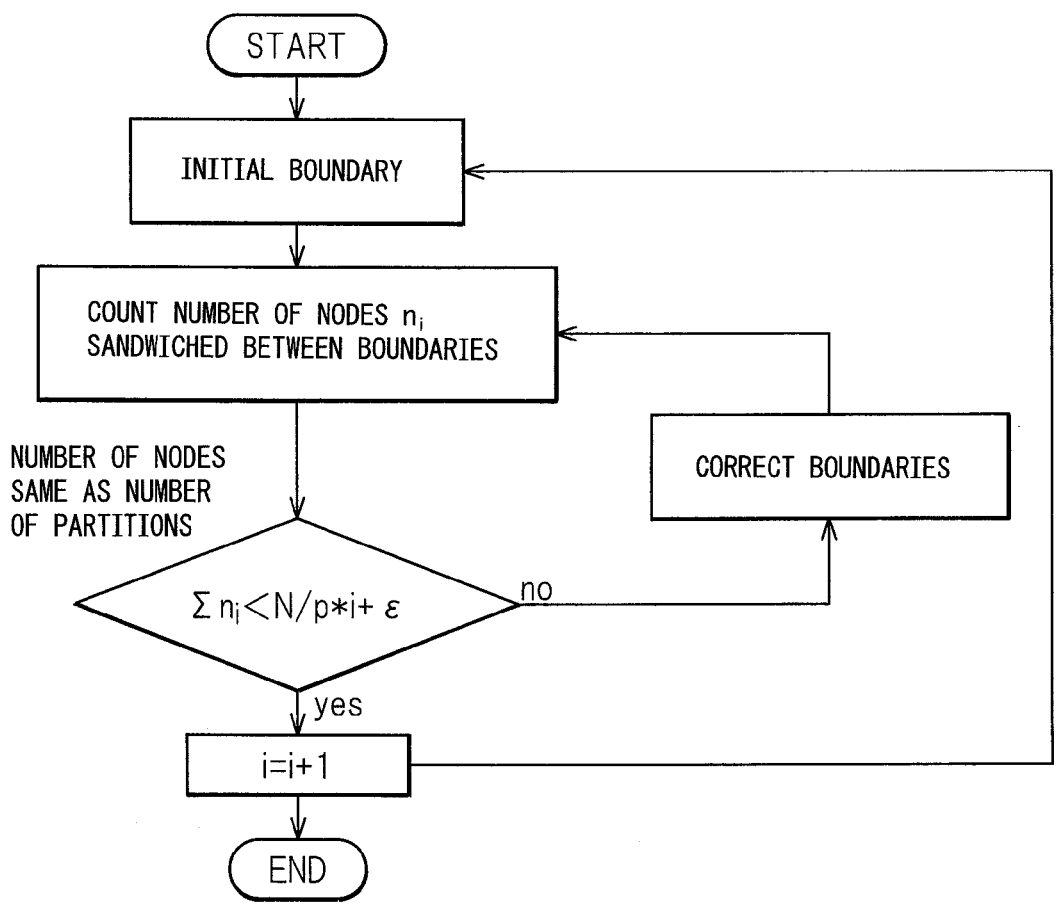
FIG. 31 is a view for explaining an example of the partition processing.

Technique 1. When the number of partitions is $2^n$, as illustrated in FIG. 30, the technique of partitioning into 2 recursively Technique 2. A certain end is used as the starting point to determine the boundaries. The number of nodes sandwiched between boundaries (number of nodes of partitioned model section) is indicated by $n_i$, the total number of nodes of the biodata model is indicated by N, and the number of partitions is indicated by P. The number of nodes from one end to the i-th boundary $b_i$ is counted (that is, the sum $\Sigma n_i$ of the number of nodes). The boundaries $b_i$ are corrected so that this becomes proportional to the partitioned number of nodes. After this, the processing is performed in order. (FIG. 31)

The case of a total number of 16 nodes partitioned into 3 will be explained.

The number of nodes of the partitioned model sections would become 5.3, so the partitioned model sections are constructed to have around five nodes. The partitioned model sections are determined from the end. As shown in FIG. 32(b), if counting the number of nodes at a boundary, the number illustrated in the figure becomes 2. The boundary is therefore shifted slightly and the number of nodes counted again. This is repeated until the number becomes about 5. Once satisfying this condition, as illustrated in FIG. 32(c), the next boundary is given and similar processing is performed.

Figure 33:
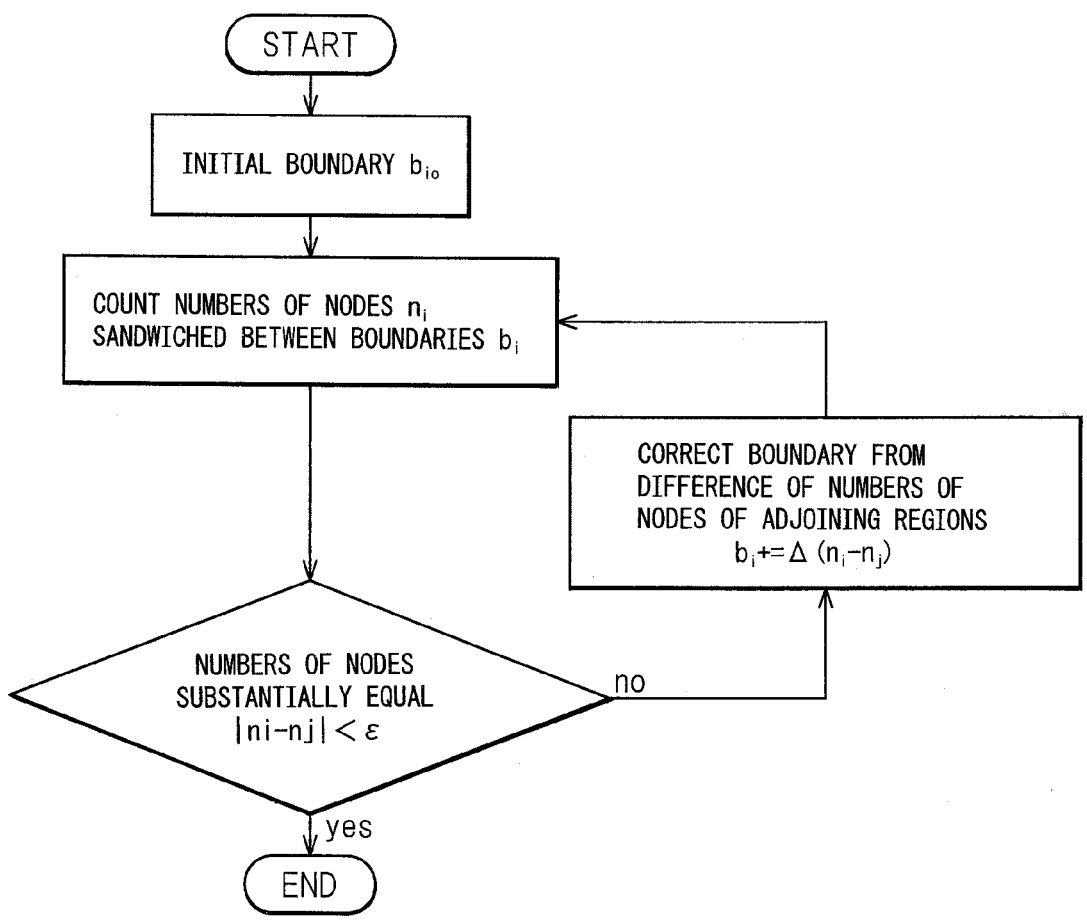
FIG. 33 is a view for explaining an example of the partition processing.

Technique 3. All of the boundaries are set in accordance with the number of partitions. The number of nodes (number of nodes of partitioned model section) $n_i$ sandwiched between boundaries is counted and the positions of the boundaries are corrected from the difference of the adjoining nodes ($|n_i-n_j|$). When the difference of the nodes becomes a certain threshold value or less ($|n_i-n_j|<\epsilon$), the processing is ended. (FIG. 33)

The case of a total number of 16 nodes partitioned into 3 will be explained.

The number of nodes of the partitioned model sections would become 5.3, so the partitioned model sections are constructed to have around five nodes. The boundaries for partition into 3 are set at positions of distances slightly from the two ends of the model (FIG. 34(b)). At this time, regarding the left side boundary, the boundary is adjusted from the difference of the numbers of nodes of the adjoining regions. The left side of the boundary has 2 nodes, while the right side has 10, so the boundary is made to move to the right side. Regarding the right side boundary, the boundary is adjusted from the difference of the numbers of nodes of the adjoining regions. The left side of the boundary has 10 nodes, while the right side has 4, so the boundary is made to move to the left side. This is repeated. As illustrated in FIG. 34(c), for the left side boundary, the left side of the boundary has 5 nodes, while the right side has 6, so the numbers become substantially the same and the object has been achieved. For the right side boundary, the left side of the boundary has 6 nodes, while the right side has 5 nodes, so the numbers become substantially the same and the object has been achieved.

The invention claimed is:

1. A computer-implemented biodata model preparation method of preparing a dynamic 3D (three-dimensional) data model of a live body from CT (computed tomography) images of the live body and MRI (magnetic resonance imaging) images of the live body, the biodata model preparation method comprising:

generating CT/MRI images of the live body with pixels having CT values and MRI values by correcting distortion of the MRI images from the CT images and laying the corrected MRI image over the CT images;

generating 3D data where 3D regions of organs targeted for modeling are identified by determining 3D regions corresponding to organs targeted for modeling in the CT/MRI images;

converting CT values and/or MRI values of pixels in the 3D regions in the 3D data to physical values; and generating a dynamic 3D data model of the live body expressed by a set of tetrahedron elements from the 3D data having the physical values.

2. The method according to claim 1, wherein said generating the CT/MRI images comprises:

determining projection transforms which convert coordinates of the MRI images to coordinates of the CT images using coordinates of a plurality of features in the MRI images and coordinates of points in the CT images corresponding to said plurality of features; and converting coordinates of the MRI images to coordinates of the CT images using said projection transforms and linear interpolation.

3. The method according to claim 1, wherein said generating the 3D data comprises, in a local region of a predetermined size centered about a target point, making a determination regarding pixel values using a threshold value determined from a median value of pixel values of pixels already determined to be inside a 3D region and a median value of pixels values of pixels already determined to be outside said 3D region to determine if the pixels are inside or outside of said 3D region.

4. The method according to claim 3, wherein said generating the 3D data comprises interactively correcting results of the determination obtained using said threshold value.

5. The method according to claim 1, wherein said converting values comprises converting CT values and/or MRI values to physical values by referring to a physical value table which stores relationships of said CT values and/or said MRI values with said physical values.

6. The method according to claim 5, wherein said physical values stored with said relationships of said CT values and/or MRI values are physical values of parts where injury has occurred.

7. The method according to claim 1, wherein said generating the dynamic 3D data model of the live body comprises:

sampling said 3D data at predetermined intervals; and determining a position of a boundary plane based on values of data between adjoining sampling points when determining a boundary plane of the inside/outside positions of a region between adjoining sampling points.

8. The method according to claim 1, wherein said generating the dynamic 3D data model of the live body comprises:

determining a boundary plane between the inside/outside positions of a region, which boundary plane is comprised of a plurality of nodes; and correcting the positions of nodes forming said boundary plane based on the positions of nearby nodes so as to smooth the boundary plane.

9. A biodata model preparation apparatus which prepares a dynamic 3D (three-dimensional)data model of a live body from CT (computed tomography) images of the live body and MRI (magnetic resonance imaging) images of the live body, the biodata model preparation apparatus comprising;

a module generating CT/MRI images of the live body with pixels having CT values and MRI values by correcting distortion of the MRI images from the CT images and laying them over the CT images;

a module determining 3D regions corresponding to organs targeted for modeling in the CT/MRI images to thereby generate 3D data where 3D regions of organs targeted for modeling are identified;

a module converting CT values and/or MRI values of pixels in the 3D regions in the 3D data to physical values; and a module generating a dynamic 3D data model of the live body expressed by a set of tetrahedron elements from the 3D data having the physical values.

10. The apparatus according to claim 9, wherein said CT/MRI images generating module comprises:

a module determining projection transforms which convert coordinates of the MRI images to coordinates of the CT images using coordinates of a plurality of features in the MRI images and coordinates of points in the CT images corresponding to said plurality of features; and a module converting coordinates of the MRI images to coordinates of the CT images using said projection transforms and linear interpolation.

11. The apparatus according to claim 9, wherein said 3D data generating module comprises:

a module, in a local region of a predetermined size centered about a target point, for making a determination regarding pixel values using a threshold value determined from a median value of pixel values of pixels already determined to be inside a 3D region and a median value of pixel values of pixels already determined to be outside said 3D region to determine if the pixels are inside or outside of said 3D region.

12. The apparatus according to claim 11, wherein said 3D region determining module includes a module interactively correcting results of the determination obtained using said threshold value.

13. The apparatus according to claim 9, wherein said values converting module comprises:

a module converting CT values and/or MRI values to physical values by referring to a physical value table which stores the relationship of said CT values and/or said MRI values with said physical values.

14. The apparatus according to claim 13, wherein said physical values stored with said relationships of said CT values and/or said MRI values are physical values of parts where injury has occurred.

15. The apparatus according to claim 9, wherein said dynamic 3D data model of the live body generating module comprises:

a module sampling said 3D data at predetermined intervals and a module determining a position of a boundary plane based on values of data between adjoining sampling points when determining a boundary plane of inside/outside positions of a region between adjoining sampling points.

16. The apparatus according to claim 9, wherein said dynamic 3D data model of the live body generating module comprises:

a module determining a boundary plane between inside/outside positions of a region, which boundary plane is comprised of a plurality of nodes; and a module correcting the positions of nodes forming said boundary plane based on the positions of nearby nodes so as to smooth the boundary plane.

17. A load dispersion method of a 3D (three-dimensional) data model, the method comprising:

partitioning, into a number P, a load among a P number of processing devices, when simulating motion for a 3D data model prepared from medical image data, performing, by the P number of processing devices, simulation processing in parallel,
wherein the numbers of vertices of finite elements of the 3D data model become substantially uniform, and
wherein the partition planes do not intersect in the 3D data model.

18. A load dispersion system comprising:
a P number of processing devices which perform simulation processing in parallel when simulating motion for a 3D (three-dimensional) data model prepared from medical image data and partition the load into the number P,
wherein the numbers of vertices of finite elements of the 3D data model become substantially uniform, and
wherein the partition planes do not intersect in the 3D data model; and
communication lines which connect adjoining processing devices among the plurality of processing devices.

19. A biodata model preparation apparatus which prepares a dynamic 3D (three-dimensional) data model of a live body from CT (computed tomography) images of the live body and MRI (magnetic resonance imaging) images of the live body, the biodata model preparation apparatus comprising;
means for generating CT/MRI images of the live body with pixels having CT values and MRI values by correcting distortion of the MRI images form the CT images and laying them over the CT images;
means for determining 3D regions corresponding to organs targeted for modeling in the CT/MRI images to thereby generate 3D data where 3D regions of organs targeted for modeling are identified;
means for converting CT values and/or MRI values of pixels in the 3D regions in the 3D data to physical values; and
means for generating a dynamic 3D data model of the live body expressed by a set of tetrahedron elements from the 3D data having the physical values.

* * * * *